(12) United States Patent
Kato

(10) Patent No.: US 7,425,484 B2
(45) Date of Patent: Sep. 16, 2008

(54) METHOD OF MANUFACTURING SEMICONDUCTOR DEVICE

(75) Inventor: Juri Kato, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 167 days.

(21) Appl. No.: 11/372,844

(22) Filed: Mar. 9, 2006

(65) Prior Publication Data
US 2006/0202271 A1 Sep. 14, 2006

(30) Foreign Application Priority Data

| Mar. 9, 2005 | (JP) | ............................. 2005-064996 |
| Feb. 17, 2006 | (JP) | ............................. 2006-040478 |

(51) Int. Cl.
*H01L 21/8238* (2006.01)

(52) U.S. Cl. ........................ 438/199; 438/209; 438/270; 257/E21.415; 257/E21.703

(58) Field of Classification Search ................. 438/199, 438/209, 212, 270, 280, 153; 257/350, 351, 257/E21.415, E21.173
See application file for complete search history.

(56) References Cited

U.S. PATENT DOCUMENTS

| 6,236,089 B1 * | 5/2001 | Ju ................................ 257/369 |
| 7,078,723 B2 * | 7/2006 | Lin et al. ....................... 257/19 |
| 2005/0255678 A1 * | 11/2005 | Kato ........................... 438/478 |
| 2005/0269645 A1 * | 12/2005 | Kato ........................... 257/371 |

FOREIGN PATENT DOCUMENTS

| JP | 2000-124092 | 4/2000 |
| JP | 2002-299591 | 10/2002 |

OTHER PUBLICATIONS

T. Sakai et al., Separation by Bonding Si Islands (SBBI) for LSI Applications, Second International SiGe Technology and Device Meeting, Meeting Abstract, May 2004, pp. 230-231.

* cited by examiner

*Primary Examiner*—Tuan N. Quach
(74) *Attorney, Agent, or Firm*—John J. Penny, Jr.; Edwards Angell Palmer & Dodge LLP

(57) ABSTRACT

A method of manufacturing a semiconductor device includes forming on a semiconductor substrate, a plurality of multi-layered structures each including a first semiconductor layer and a second semiconductor layer that is deposited over the first semiconductor layer and has an etching rate smaller than the etching rate of the first semiconductor layer, forming a first trench through the first semiconductor layer and the second semiconductor layer, forming a support body on sidewalls of the first semiconductor layer and the second semiconductor layer in the first trench, forming a second trench that exposes through the second semiconductor layer, etching the first semiconductor layer via the second trench selectively, to form under the second semiconductor layer, a cavity resulting from removal of the first semiconductor layer, forming a buried insulating layer that is buried in the cavity, exposing a side surface of the deposited second semiconductor layer, forming a gate insulating film on the exposed side surface of the second semiconductor layer, forming a gate electrode over the side surface of the second semiconductor layer with intermediary of the gate insulating film there between, implementing first ion-implantation through the top surface of the second semiconductor layer, implementing second ion-implantation through the top surface of the second semiconductor layer.

3 Claims, 18 Drawing Sheets

METHOD OF MANUFACTURING SEMICONDUCTOR DEVICE

BACKGROUND OF THE INVENTION

1. Technical Field

The present invention relates to a semiconductor device and a method of manufacturing a semiconductor device, and particularly to a semiconductor device that is preferably applied to a multi-layer structure of field effect transistors having different conductivity types.

2. Related Art

Increasing attention is being paid to availability of a field effect transistor formed on an SOI substrate due to its advantages: easiness of element isolation, latch-up free, small source-to-drain coupling capacitance, and so on. In particular, a full depletion SOI transistor can achieve low power consumption and high-speed operation, and can easily be driven with a low voltage. Therefore, studies are strenuously progressed to operate an SOI transistor in the full depletion mode. As the SOI substrate, a separation-by-implanted-oxygen (SIMOX) wafer, a bonded wafer or the like is used as disclosed in e.g. JP-A-2002-299591 and JP-A-2000-124092, which are examples of the related-art documents.

In a complementary metal oxide semiconductor (CMOS) circuit such as a flip-flop, and an SRAM of which cells are each formed of six transistors, P-channel field effect transistors and N-channel field effect transistors are horizontally arranged adjacent to each other on the same two-dimensional plane.

When fabricating a SIMOX wafer, however, it is needed to ion-implant high concentration oxygen into a silicon wafer. When fabricating a bonded wafer, after two silicon wafers are bonded to each other, the surfaces of the silicon wafers need to be polished. Therefore, an SOI transistor problematically involves higher fabrication costs compared with a field effect transistor formed on a bulk semiconductor.

In addition, the ion-implantation and polishing involve a problem that variation in the film thickness of an SOI layer is large, and therefore it is difficult to stabilize characteristics of a field effect transistor when an SOI layer with a small thickness is formed in order to fabricate a full depletion SOI transistor.

Furthermore, if a plurality of transistors included in a flip-flop or SRAM are disposed on the same two-dimensional plane, the area required for forming the flip-flop or SRAM is large, which problematically precludes high-density integration. Moreover, another problem also arises that the length of interconnects required for coupling the plural transistors in the flip-flop or SRAM is large and therefore propagation delay is also large.

SUMMARY

An advantage of some aspects of the invention is to provide a semiconductor device and a method of manufacturing a semiconductor device that each allow stacking of field effect transistors and low-cost formation of semiconductor layers for the field effect transistors on insulators.

A semiconductor device according to a first aspect of the invention includes a first power supply interconnect formed of a first single-crystal semiconductor layer and coupled to a first potential, and a second power supply interconnect formed of a second single-crystal semiconductor layer and coupled to a second potential. The second single-crystal semiconductor layer is deposited over the first single-crystal semiconductor layer.

According to the first aspect, the source/drain layers of field effect transistors can be used as power supply interconnects while allowing stacking of the field effect transistors. Accordingly, a flip-flop or an SRAM hybridized with a memory or logic can be constructed while suppressing an increase of the chip size.

A semiconductor device according to a second aspect of the invention includes first and second single-crystal semiconductor layers that are deposited over top of each other with intermediary of an insulating layer therebetween, and a first P-channel field effect transistor formed in the first single-crystal semiconductor layer and a first N-channel field effect transistor formed in the second single-crystal semiconductor layer. The first P-channel field effect transistor and the first N-channel field effect transistor have a first gate electrode in common. The semiconductor device also includes a second P-channel field effect transistor formed in the first single-crystal semiconductor layer and a second N-channel field effect transistor formed in the second single-crystal semiconductor layer. The second P-channel field effect transistor and the second N-channel field effect transistor have a second gate electrode in common. The semiconductor device further includes a first interconnect that couples drains of the first P-channel field effect transistor and the first N-channel field effect transistor with the second gate electrode, and a second interconnect that couples drains of the second P-channel field effect transistor and the second N-channel field effect transistor with the first gate electrode.

According to the second aspect, channel regions can be formed in the sidewalls of semiconductor layers. Therefore, without disposing a gate electrode over the top surface of the lower semiconductor layer, field effect transistors can be stacked and a flip-flop hybridized with a memory or logic can be constructed. Therefore, the area required for forming a flip-flop can be reduced, and the length of interconnects required for coupling the plural transistors included in the flip-flop can be decreased. Thus, high-speed operation of the flip-flop is allowed while reducing power consumption thereof, and high-density integration can be achieved.

The semiconductor device according to the second aspect preferably further includes first and second power supply interconnects formed in the first and second single-crystal semiconductor layers, respectively, and coupled to first and second potentials, respectively. The first and second power supply interconnects are disposed between the first and second gate electrodes.

Thus, the source/drain layers of field effect transistors can be used as power supply interconnects while allowing stacking of the field effect transistors. Accordingly, a flip-flop hybridized with a memory or logic can be constructed while suppressing an increase of the chip size.

The semiconductor device according to the second aspect preferably further includes first and second transfer gates formed in the first and second single-crystal semiconductor layers, respectively, and having a third gate electrode in common.

Since the transfer gates are formed in the first and second single-crystal semiconductor layers in which a flip-flop is formed, an SRAM hybridized with a memory or logic can be constructed while allowing stacking of the transfer gates. Accordingly, the area required for forming an SRAM can be reduced, and the length of interconnects required for coupling the plural transistors included in the SRAM can be decreased. Thus, high-speed operation of the SRAM is allowed while reducing power consumption thereof, and high-density integration can be achieved.

The semiconductor device according to the second aspect preferably further includes first and second transfer gates formed in a polycrystalline semiconductor layer or a single-crystal semiconductor layer that is deposited over the first and second single-crystal semiconductor layers.

Thus, while allowing stacking of field effect transistors included in a flip-flop, and formation of the flip-flop in single-crystal semiconductor layers, an SRAM formed by disposing transfer gates over the flip-flop can be constructed while suppressing deterioration of characteristics of the SRAM. Accordingly, the area required for forming an SRAM can be reduced, and the length of interconnects required for coupling the plural transistors included in the SRAM can be decreased. Thus, high-speed operation of the SRAM is allowed while reducing power consumption thereof, and high-density integration can be achieved.

A method of manufacturing a semiconductor device according to a third aspect of the invention includes forming on a semiconductor substrate, a plurality of multi-layered structures each including a first semiconductor layer and a second semiconductor layer that is deposited over the first semiconductor layer and has an etching rate smaller than the etching rate of the first semiconductor layer, forming a first trench that exposes the semiconductor substrate through the first semiconductor layer and the second semiconductor layer, and forming a support body on sidewalls of the first semiconductor layer and the second semiconductor layer in the first trench. The support body supports the second semiconductor layer over the semiconductor substrate. The method also includes forming a second trench that exposes through the second semiconductor layer, at least part of the first semiconductor layer of which sidewall has the support body thereon, etching the first semiconductor layer via the second trench selectively, to form under the second semiconductor layer, a cavity resulting from removal of the first semiconductor layer, forming a buried insulating layer that is buried in the cavity, exposing a side surface of the deposited second semiconductor layer through the insulating layer, and forming a gate insulating film on the exposed side surface of the second semiconductor layer. The method further includes forming a gate electrode over the side surface of the second semiconductor layer with intermediary of the gate insulating film therebetween, implementing first ion-implantation through the top surface of the second semiconductor layer, to form in the second semiconductor layer at a lower layer level, first source and drain layers on respective sides of the gate electrode, and implementing second ion-implantation through the top surface of the second semiconductor layer, to form in the second semiconductor layer at an upper layer level, second source and drain layers on respective sides of the gate electrode.

According to the third aspect, the second semiconductor layers can be supported over the semiconductor substrate by the support body formed in the first trench. In addition, an etching gas or etchant can be brought into contact with the first semiconductor layers under the second semiconductor layers via the second trench. Thus, the first semiconductor layers between the second semiconductor layers can be removed while allowing the second semiconductor layers to be supported stably over the semiconductor substrate. Accordingly, insulation among the second semiconductor layers can be ensured without deteriorating the quality of the second semiconductor layers.

As a result, stacked field effect transistors can be formed in single-crystal semiconductor layers without employing an SOI substrate. Thus, three-dimensional integration of field effect transistors can be achieved while suppressing cost-up.

In addition, the parasitic capacitance of the field effect transistors can be reduced, and a steep subthreshold characteristic can be obtained. Accordingly, a flip-flop or SRAM that can be operated at high speed with a low voltage can be achieved.

In the method of manufacturing a semiconductor device according to the third aspect, the first ion-implantation preferably implants boron in the second semiconductor layer at the lower layer level, to form in the second semiconductor layer at the lower layer level, an interconnect for providing a first potential, and source and drain layers of a P-channel field effect transistor that forms a flip-flop circuit, and the second ion-implantation preferably implants phosphorous or arsenic in the second semiconductor layer at the upper layer level, to form in the second semiconductor layer at the upper layer level, an interconnect for providing a second potential, and source and drain layers of an N-channel field effect transistor that forms the flip-flop circuit.

Thus, a P-channel field effect transistor can be disposed in the lower second semiconductor layer, and an N-channel field effect transistor can be disposed in the upper second semiconductor layer. Therefore, an impurity having a small mass number can be implanted into the lower second semiconductor layer, and an impurity having a large mass number can be implanted into the upper second semiconductor layer. Accordingly, although an impurity is implanted into the lower second semiconductor layer through the upper second semiconductor layer, damage to the upper second semiconductor layer can be suppressed. As a result, a flip-flop can be formed of CMOS inverters, and field effect transistors included in the flip-flop can be stacked. Thus, high-speed operation of the flip-flop is allowed while reducing power consumption thereof, and high-density integration of the flip-flop can be achieved.

In the method of manufacturing a semiconductor device according to the third aspect, the first ion-implantation preferably implants boron in the second semiconductor layer at the lower layer level, to form in the second semiconductor layer at the lower layer level, an interconnect for providing a first potential, and source and drain layers of P-channel field effect transistors that form a flip-flop circuit, and the second ion-implantation preferably implants phosphorous or arsenic in the second semiconductor layer at the upper layer level, to form in the second semiconductor layer at the upper layer level, an interconnect for providing a second potential, and source and drain layers of N-channel field effect transistors that form the flip-flop circuit and a first transfer gate, and the third ion-implantation preferably implants phosphorous or arsenic in the second semiconductor layer at the lower layer level, to form in the second semiconductor layer at the lower layer level, an interconnect for providing source and drain layers of N-channel field effect transistors that form a second transfer gate.

Thus, while allowing formation of a flip-flop by CMOS inverters and stacking of field effect transistors included in the flip-flop, transfer gates can be formed in the second semiconductor layers in which the flip-flop is formed. Therefore, an SRAM can be achieved without horizontally arranging six transistors included in each cell of the SRAM on the same two-dimensional plane. Accordingly, high-speed operation of the SRAM is allowed while reducing power consumption thereof, and high-density integration of the SRAM can be achieved.

BRIEF DESCRIPTION OF THE DRAWINGS

The invention will be described with reference to the accompanying drawings, wherein like numbers refer to like elements.

DESCRIPTION OF EXEMPLARY EMBODIMENTS

A semiconductor device and a manufacturing method thereof according to embodiments of the invention will be described below with reference to the drawings.

Figure 1:
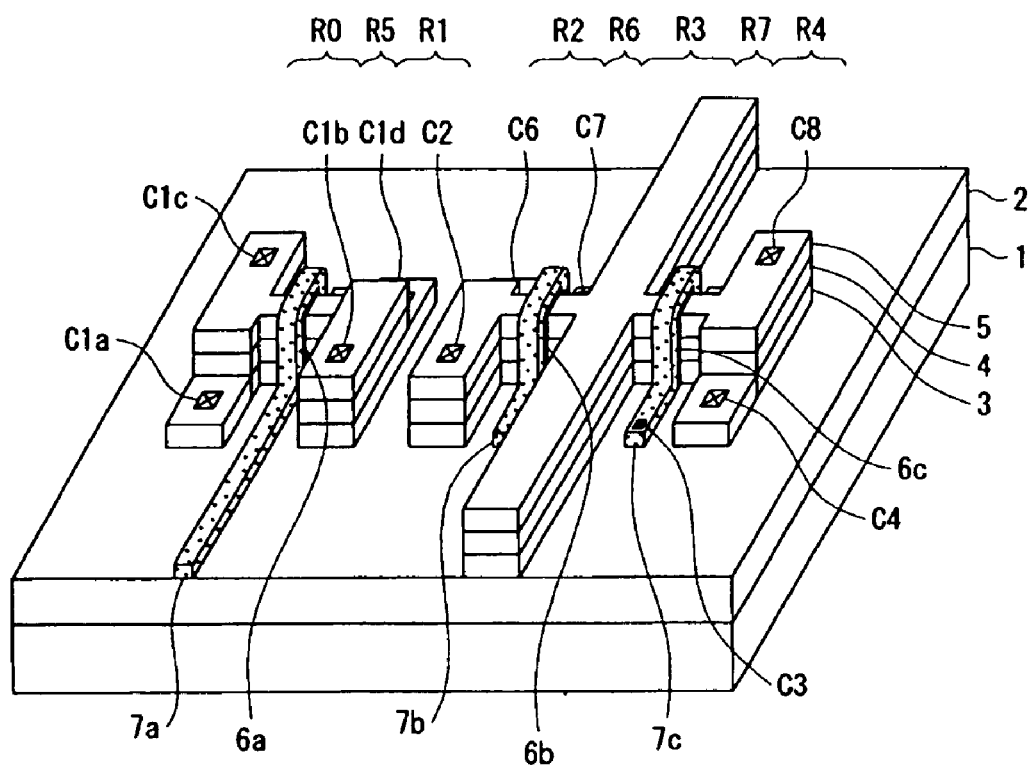
FIG. 1 is a perspective view illustrating the schematic structure of a semiconductor device according to a first embodiment of the invention.
Figure 2:
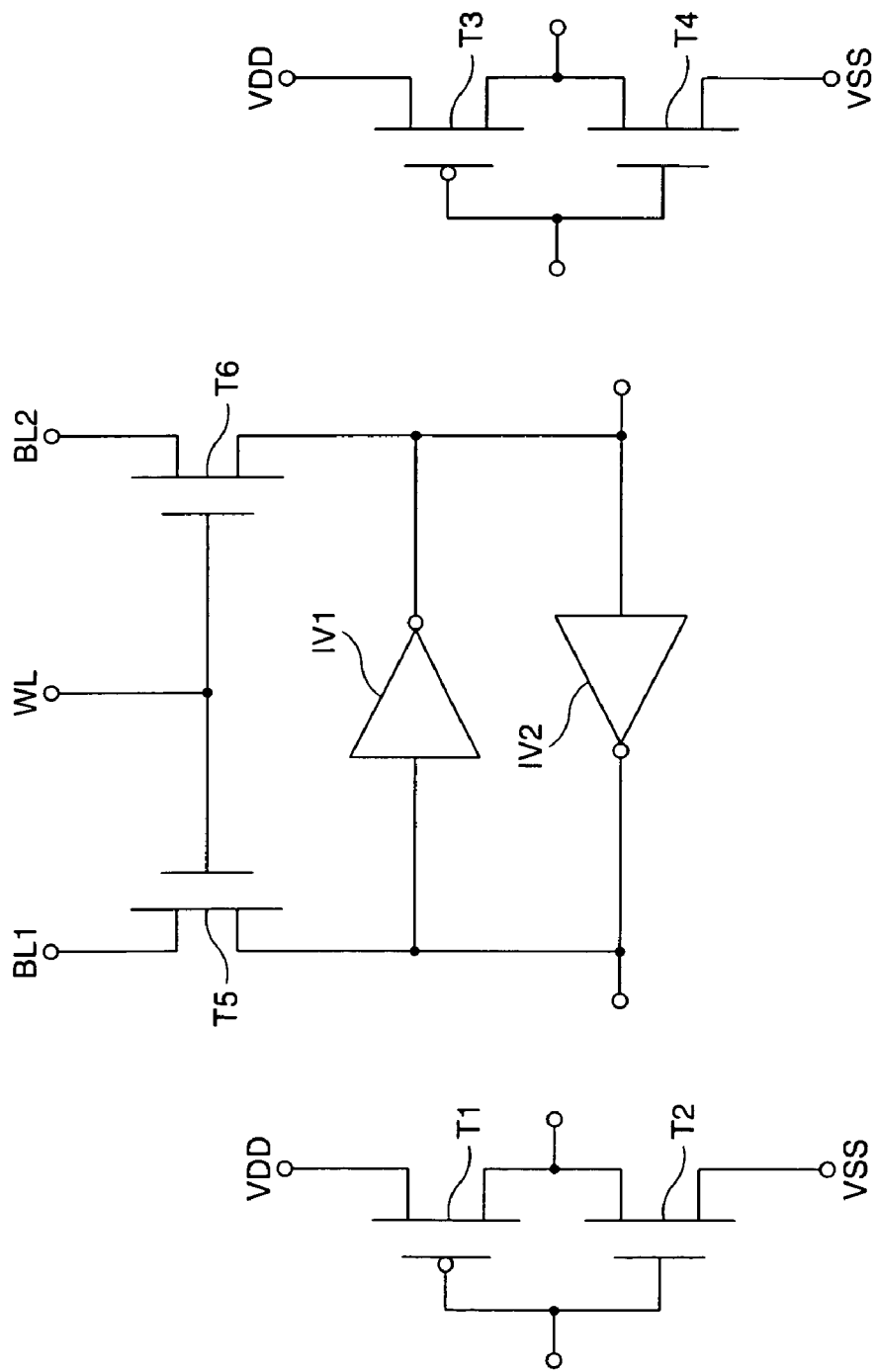
FIG. 2 is a diagram illustrating the circuit configuration of the semiconductor device of FIG. 1.

FIG. 1 is a perspective view illustrating the schematic structure of a semiconductor device according to a first embodiment of the invention. FIG. 2 is a diagram illustrating the circuit configuration of the semiconductor device of FIG. 1.

Referring to FIG. 2, an SRAM includes CMOS inverters IV1 and IV2, and transfer gates T5 and T6. The input of the CMOS inverter IV1 is coupled to the output of the CMOS inverter IV2, and the output of the CMOS inverter IV1 is coupled to the input of the CMOS inverter IV2. Thus, a flip-flop circuit is constructed.

The CMOS inverter IV1 is formed of a P-channel field effect transistor (P-ch FET, hereinafter) T1 and an N-channel field effect transistor (N-ch FET, hereinafter) T2. The P-ch FET T1 and the N-ch FET T2 are connected in series, and the gates of the P-ch FET T1 and the N-ch FET T2 are connected in common.

In the CMOS inverter IV2, a P-ch FET T3 and an N-ch FET T4 are connected in series, and the gates of the P-ch FET T3 and the N-ch FET T4 are connected in common.

The sources of the P-ch FETs T1 and T3 are coupled to a $V_{DD}$ interconnect for supplying a $V_{DD}$ potential. The sources of the N-ch FETs T2 and T4 are coupled to a $V_{SS}$ interconnect for supplying a $V_{SS}$ potential.

The gate of the transfer gate T5 is coupled to a word line WL. The drain thereof is coupled to a bit line BL1, and the source thereof is coupled to the input of the CMOS inverter IV1 and the output of the CMOS inverter IV2. The gate of the transfer gate T6 is coupled to the word line WL. The drain thereof is coupled to a bit line BL2, and the source thereof is coupled to the output of the CMOS inverter IV1 and the input of the CMOS inverter IV2.

Referring next to FIG. 1, an insulating layer 2 is formed on a support substrate 1. In addition, a semiconductor layer 3, an insulating layer 4 and a semiconductor layer 5 are sequentially deposited over the insulating layer 2. As the support substrate 1, a semiconductor substrate, such as a Si, Ge, SiGe, GaAs, InP, GaP, GaN, or SiC substrate, may be used. Alternatively, an insulating substrate, such as a glass, sapphire, or ceramic substrate, may be used. As the material of the semiconductor layers 3 and 5, e.g. Si, Ge, SiGe, SiC, SiSn, PbS, GaAs, InP, GaP, GaN or ZnSe can be used. As the material of the insulating layers 2 and 4, an insulating layer such as an $SiO_2$, SiON or $Si_3N_4$ layer, or a buried insulating film can be used for example. In addition, e.g. an SOI substrate can be used as the semiconductor substrate formed by sequentially depositing the semiconductor layer 3, the insulating layer 4 and the semiconductor layer 5 over the insulating layer 2. As the SOI substrate, a separation-by-implanted-oxygen (SIMOX) wafer, a bonded wafer or a laser-annealed wafer can be used. As the semiconductor layers 3 and 5, any of a single-crystal semiconductor layer, a polycrystalline semiconductor layer and an amorphous semiconductor layer can be used.

Provided in the semiconductor layers 3 and 5 are impurity-diffusion-layer forming regions R0 to R4 and channel forming regions R5 to R7 that are each disposed between respective two of the impurity-diffusion-layer forming regions R0 to R4. In the channel forming region R5 disposed between the impurity-diffusion-layer forming regions R0 and R1, a gate insulating film 6a is formed on the side surfaces of the semiconductor layers 3 and 5 and the top surface of the semiconductor layer 5. Furthermore, on the gate insulating film 6a, a gate electrode 7a is formed so that the gate electrode 7a extends across over the top surface of the semiconductor layer 5 to the both sidewalls of the semiconductor layers 3 and 5, and extends over the sidewalls orthogonal to the top surfaces of the semiconductor layers 3 and 5. In the channel forming region R6 disposed between the impurity-diffusion-layer forming regions R2 and R3, a gate insulating film 6b is formed on the side surfaces of the semiconductor layers 3 and 6 and the top surface of the semiconductor layer 5. Furthermore, on the gate insulating film 6b, a gate electrode 7b is formed so that the gate electrode 7b extends across over the top surface of the semiconductor layer 5 to the both sidewalls of the semiconductor layers 3 and 5, and extends over the sidewalls orthogonal to the top surfaces of the semiconductor layers 3 and 5. In addition, in the channel forming region R7 disposed between the impurity-diffusion-layer forming regions R3 and R4, a gate insulating film 6c is formed on the side surfaces of the semiconductor layers 3 and 5 and the top surface of the semiconductor layer 5. Furthermore, on the gate insulating film 6c, a gate electrode 7c is formed so that the gate electrode 7c extends across over the top surface of the semiconductor layer 5 to the both sidewalls of the semiconductor layers 3 and 5, and extends over the sidewalls orthogonal to the top surfaces of the semiconductor layers 3 and 5.

In the semiconductor layer 3 in the impurity-diffusion-layer forming regions R2 to R, P-type impurity diffusion layers are formed. In the semiconductor layer 3 in the impurity-diffusion-layer forming regions the in R0 to R1 the semiconductor layer 5 in the impurity-diffusion-layer forming regions R0 to R4, N-type impurity diffusion layers are formed.

The gate electrode 7a, and the N-type impurity diffusion layers in the semiconductor layer 3 in the impurity-diffusion-layer forming regions R0 and R1 allow the formation of the transfer gate T5 of FIG. 2. Moreover, the gate electrode 7a, and the N-type impurity diffusion layers in the semiconductor layer 5 in the impurity-diffusion-layer forming regions R0 and R1 allow the formation of the transfer gate T6 of FIG. 2. The gate electrode 7b, and the P-type impurity diffusion layers in the semiconductor layer 3 in the impurity-diffusion-layer forming regions R2 and R3 allow the formation of the P-ch FET T1 of FIG. 2. The P-type impurity diffusion layer in the semiconductor layer 3 in the impurity-diffusion-layer forming region R3 can be used as the $V_{DD}$ interconnect. The gate electrode 7b, and the N-type impurity diffusion layers in the semiconductor layer 5 in the impurity-diffusion-layer forming regions R2 and R3 allow the formation of the N-ch FET T2 of FIG. 2. The N-type impurity diffusion layer in the semiconductor layer 5 in the impurity-diffusion-layer forming region R3 can be used as the $V_{SS}$ interconnect. Furthermore, the gate electrode 7c, and the P-type impurity diffusion layers in the semiconductor layer 3 in the impurity-diffusion-layer forming regions R3 and R4 allow the formation of the P-ch FET T3 of FIG. 2. In addition, the gate electrode 7c, and the N-type impurity diffusion layers in the semiconductor layer 5 in the impurity-diffusion-layer forming regions R3 and R4 allow the formation of the N-ch FET T4 of FIG. 2.

In the impurity-diffusion-layer forming regions R0, R1, R2 and R4, ends of the semiconductor layer 3 may be exposed by removing the insulating layer 4 and the semiconductor layer 5 thereover, in order to form contact regions C1a, C1d, C6 and C4 on the semiconductor layer 3.

Subsequently, the P-type and N-type impurity diffusion layers in the impurity-diffusion-layer forming region R2 are coupled to each other via the contact regions C2 and C6, and thus the CMOS inverter IV1 of FIG. 2 can be formed. Furthermore, the P-type and N-type impurity diffusion layers in the impurity-diffusion-layer forming region R4 are coupled to each other via the contact regions C4 and C8, and thus the CMOS inverter IV2 of FIG. 2 can be formed. Moreover, the P-type and N-type impurity diffusion layers in the impurity-diffusion-layer forming region R2 are in common coupled to the gate electrode 7c via the contact regions C2, C3 and C6. In addition, the P-type and N-type impurity diffusion layers in the impurity-diffusion-layer forming region R4 are in common coupled to the gate electrode 7b via the contact regions C4, C7 and C8. Thus, the flip-flop formed of the CMOS inverters IV1 and IV2 of FIG. 2 can be constructed.

Moreover, the N-type impurity diffusion layer in the impurity-diffusion-layer forming region R0 is coupled to the bit line BL1 via the contact region C1a, and the N-type impurity diffusion layer in the impurity-diffusion-layer forming region R0 is coupled to the bit line BL2 via a contact region C1c, while the gate electrode 7a is used as the word line WL. As a result, the SRAM formed of the CMOS inverters IV1 and IV2 and the transfer gates T5 and T6 can be constructed.

As interconnects for coupling the gate electrodes and impurity diffusion layers via the contact regions C1a to C1d and C2 to C8, e.g. tungsten plug interconnects buried in an interlayer insulating film formed on the semiconductor layer 5 can be used.

According to the above described structure, channel regions can be formed in the sidewalls of the semiconductor layers 3 and 5. Therefore, without disposing the gate electrodes 7a to 7c between the semiconductor layers 3 and 5, field effect transistors can be stacked and a flip-flop or SRAM hybridized with a memory or logic can be constructed. Accordingly, the area required for forming a flip-flop or SRAM can be reduced, and the length of interconnects required for coupling the plural transistors included in the flip-flop or SRAM can be decreased. Thus, high-speed operation of the flip-flop or SRAM is allowed while reducing power consumption thereof, and high-density integration can be achieved.

In addition, the formation of the gate electrodes 7a to 7c on the both sidewalls of the semiconductor layers 3 and 5 allows the formation of channel regions in the both sidewalls of the semiconductor layers 3 and 5. Therefore, field effect transistors can be stacked without disposing the gate electrodes 7a to 7c between the semiconductor layers 3 and 5. Thus, even in the stacked field effect transistors, the flatness of top surfaces of the semiconductor layers 3 and 5 can be ensured, which can suppress deterioration of the crystallinity and can reduce defects in the boundaries among the semiconductor layers 3 and 5 and the gate insulating films 6a to 6c. As a result, a flip-flop or SRAM can be operated at high speed with a low voltage, and the high-density integration of the flip-flop or SRAM is allowed.

Moreover, since the gate electrodes 7a to 7c are disposed over the sidewalls of the semiconductor layers 3 and 5 so as to extend orthogonal to the top surfaces of the semiconductor layers 3 and 5, the gate electrodes 7a to 7c that are used in common to the semiconductor layers 3 and 5 can be disposed upright. Therefore, the occupation area of the gate electrodes 7a to 7c in the chip face can be reduced, and the interconnect length of the gate electrodes 7a to 7c can be decreased. Thus, the chip size can be decreased while suppressing propagation delay.

Figure 3:
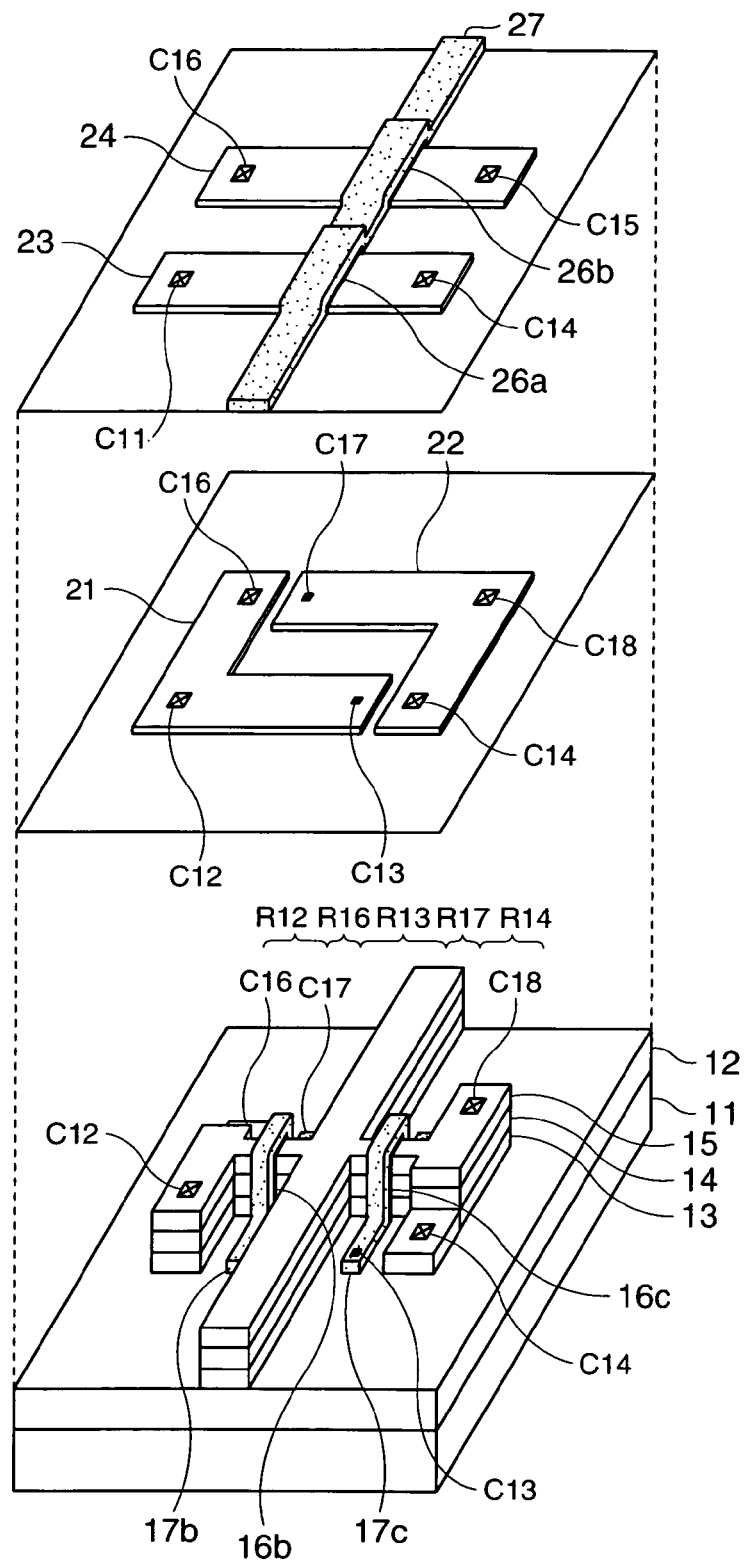
FIG. 3 is a perspective view illustrating the schematic structure of a semiconductor device according to a second embodiment of the invention.

FIG. 3 is a perspective view illustrating the schematic structure of a semiconductor device according to a second embodiment of the invention.

Referring to FIG. 3, an insulating layer 12 is formed on a support substrate 11. In addition, a semiconductor layer 13, an insulating layer 14 and a semiconductor layer 15 are sequentially deposited over the insulating layer 12. As the semiconductor layers 13 and 15, any of a single-crystal semiconductor layer, a polycrystalline semiconductor layer and an amorphous semiconductor layer can be used.

Provided in the semiconductor layers 13 and 15 are impurity-diffusion-layer forming regions R12 to R14 and channel forming regions R16 and R17 that are each disposed between respective two of the impurity-diffusion-layer forming regions R12 to R14. In the channel forming region R16 disposed between the impurity-diffusion-layer forming regions R12 and R13, a gate insulating film 16b is formed on the side surfaces of the semiconductor layers 13 and 15 and the top surface of the semiconductor layer 15. Furthermore, on the gate insulating film 16b, a gate electrode 17b is formed so that the gate electrode 17b extends across over the top surface of the semiconductor layer 15 to the both sidewalls of the semiconductor layers 13 and 15, and extends over the sidewalls orthogonal to the top surfaces of the semiconductor layers 13 and 15. In addition, in the channel forming region R17 disposed between the impurity-diffusion-layer forming regions R13 and R14, a gate insulating film 16c is formed on the side surfaces of the semiconductor layers 13 and 15 and the top surface of the semiconductor layer 15. Furthermore, on the gate insulating film 16c, a gate electrode 17c is formed so that the gate electrode 17c extends across over the top surface of the semiconductor layer 15 to the both sidewalls of the semiconductor layers 13 and 15, and extends over the sidewalls orthogonal to the top surfaces of the semiconductor layers 13 and 15.

In the semiconductor layer 13 in the impurity-diffusion-layer forming regions R12 to R14, P-type impurity diffusion layers are formed. In the semiconductor layer 15 in the impurity-diffusion-layer forming regions R12 to R14, N-type impurity diffusion layers are formed.

The gate electrode 17b, and the P-type impurity diffusion layers in the semiconductor layer 13 in the impurity-diffusion-layer forming regions R12 and R13 allow the formation of the P-ch FET T1 of FIG. 2. The P-type impurity diffusion layer in the semiconductor layer 13 in the impurity-diffusion-layer forming region R13 can be used as the $V_{DD}$ interconnect. The gate electrode 17b, and the N-type impurity diffusion layers in the semiconductor layer 15 in the impurity-diffusion-layer forming regions R12 and R13 allow the formation of the N-ch FET T2 of FIG. 2. The N-type impurity diffusion layer in the semiconductor layer 15 in the impurity-diffusion-layer forming region R13 can be used as the $V_{SS}$ interconnect. Furthermore, the gate electrode 17c, and the P-type impurity diffusion layers in the semiconductor layer 13 in the impurity-diffusion-layer forming regions R13 and R14 allow the formation of the P-ch FET T3 of FIG. 2. In addition, the gate electrode 17c, and the N-type impurity diffusion layers in the semiconductor layer 15 in the impurity-diffusion-layer forming regions R13 and R14 allow the formation of the N-ch FET T4 of FIG. 2.

In the impurity-diffusion-layer forming regions R12 and R14, ends of the semiconductor layer 13 may be exposed by removing the insulating layer 14 and the semiconductor layer 15 thereover, in order to form contact regions C16 and C14 on the semiconductor layer 13.

Subsequently, the P-type and N-type impurity diffusion layers in the impurity-diffusion-layer forming region R12 are coupled to each other via the contact regions C12 and C16, and thus the CMOS inverter IV1 of FIG. 2 can be formed. Furthermore, the P-type and N-type impurity diffusion layers in the impurity-diffusion-layer forming region R14 are coupled to each other via the contact regions C14 and C18, and thus the CMOS inverter IV2 of FIG. 2 can be formed. The P-type and N-type impurity diffusion layers in the impurity-diffusion-layer forming region R12 are in common coupled to the gate electrode 17c via the contact regions C12, C13 and C16. In addition, the P-type and N-type impurity diffusion layers in the impurity-diffusion-layer forming region R14 are in common coupled to the gate electrode 17b via the contact regions C14, C17 and C18. Thus, the flip-flop formed of the CMOS inverters IV1 and IV2 of FIG. 2 can be constructed.

Formed over the semiconductor layer 15 are an interconnect 21 for coupling the contact regions C12, C13 and C16 and an interconnect 22 for coupling the contact regions C14, C17 and C18.

Polycrystalline semiconductor layers 23 and 24 are formed over the interconnects 21 and 22. A gate electrode 27 is formed over the polycrystalline semiconductor layers 23 and 24 with the intermediary of gate insulating films 26a and 26b therebetween, respectively. The polycrystalline semiconductor layers 23 and 24 may be converted into single-crystal layers by use of laser annealing or the like. The polycrystalline semiconductor layers 23 and 24 are doped with an impurity for forming source and drain layers on the respective sides of the gate electrode 27.

The transfer gate T5 of FIG. 2 can be formed of the gate electrode 27, and the source and drain layers formed in the polycrystalline semiconductor layer 23. In addition, the transfer gate T6 of FIG. 2 can be formed of the gate electrode 27, and the source and drain layers formed in the polycrystalline semiconductor layer 24.

One of the source and drain layers formed in the polycrystalline semiconductor layer 23 is coupled to the bit line BL1 via the contact region C11. The other of the source and drain layers formed in the polycrystalline semiconductor layer 23 is coupled to the interconnect 22 via the contact region C14. One of the source and drain layers formed in the polycrystalline semiconductor layer 24 is coupled to the bit line BL2 via the contact region C15. The other of the source and drain layers formed in the polycrystalline semiconductor layer 24 is coupled to the interconnect 21 via the contact region C16. The gate electrode 27 is used as the word line WL. As a result, an SRAM formed of the CMOS inverters IV1 and IV2 and the transfer gates T5 and T6 can be constructed.

As interconnects for coupling the gate electrodes and impurity diffusion layers via the contact regions C11 to C18, e.g. tungsten plug interconnects buried in an interlayer insulating film on the semiconductor layer 15 can be used.

According to the above-described structure, field effect transistors included in a flip-flop can be stacked, and the flip-flop can be formed in single-crystal semiconductor layers. In addition, an SRAM formed by disposing transfer gates over the flip-flop can be constructed while suppressing deterioration of characteristics of the SRAM. Accordingly, the area required for forming an SRAM can be reduced, and the length of interconnects required for coupling the plural transistors included in the SRAM can be decreased. Thus, high-speed operation of the SRAM is allowed while reducing power consumption thereof, and high-density integration can be achieved.

Figure 4A:
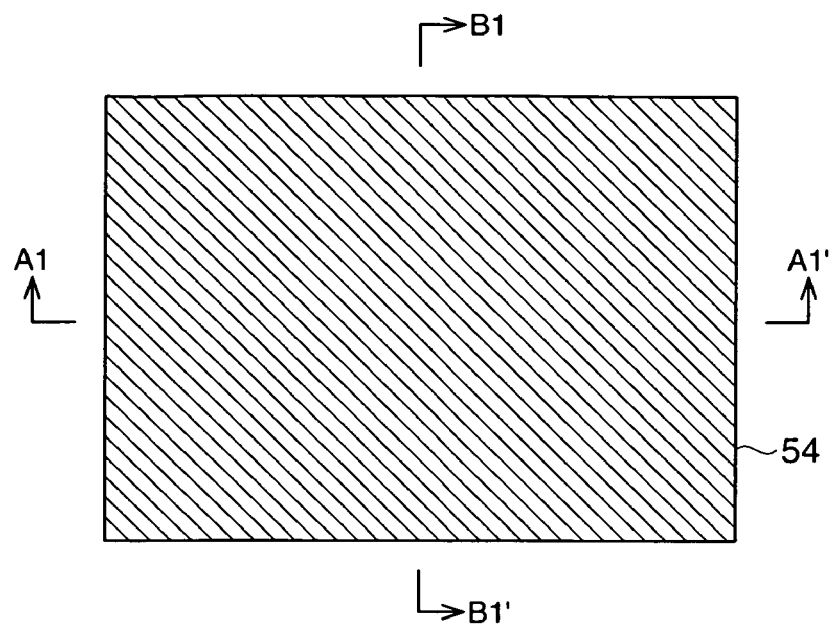
FIGS. 4A to 4C, 5A to 5C, 6A to 6C, 7A to 7C, 8A to 8C, 9A to 9C, 10A to 10C, 11A to 11C, 12A to 12C, 13A to 13C, 14A to 14C, 15A to 15C, 16A to 16C, 17A to 17C, and 18A to 18C are diagrams illustrating a method of manufacturing a semiconductor device according to a third embodiment of the invention.
Figure 4B:
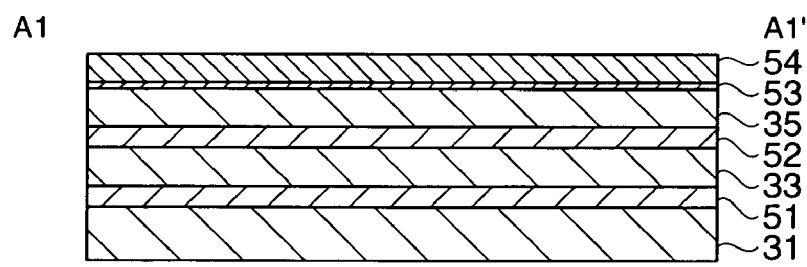
Figure 4C:
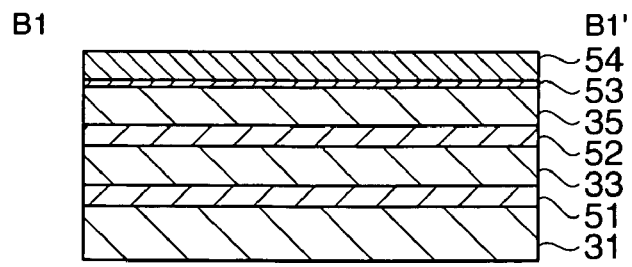
Figure 5A:
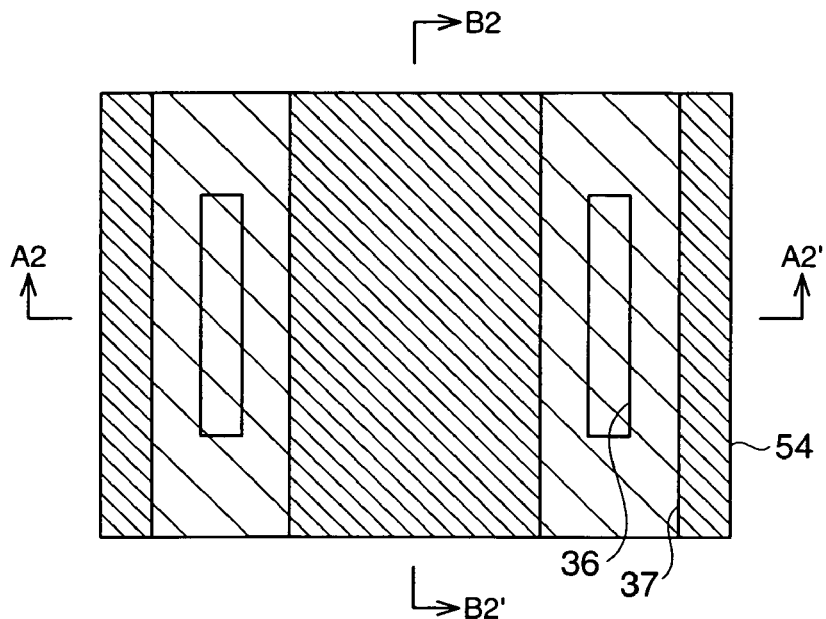
Figure 5B:
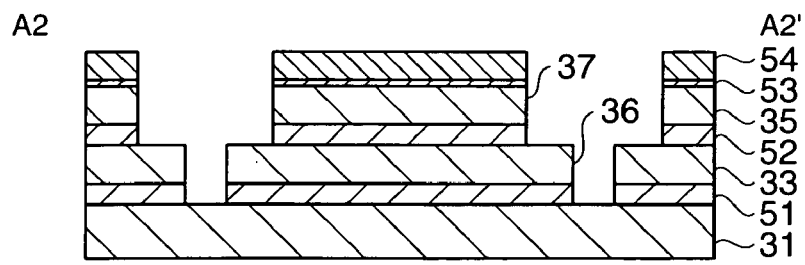
Figure 5C:
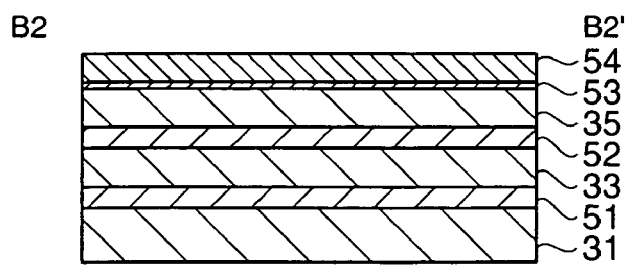
Figure 18A:
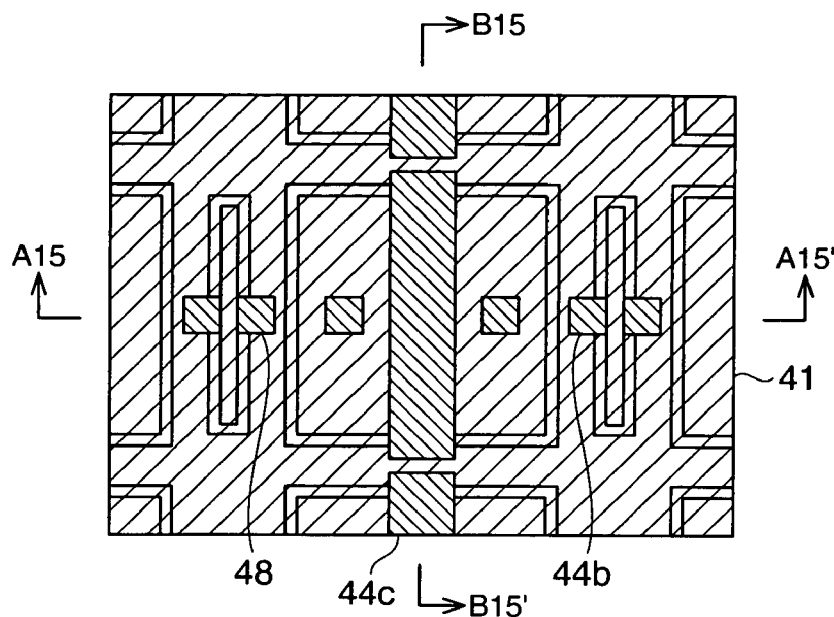

FIG. 4A, FIG. 5A, ..., and FIG. 18A (the drawings of which alphanumeric includes A) are plan views illustrating a method of manufacturing a semiconductor device according to a third embodiment of the invention. FIG. 4B, FIG. 5B, ..., and FIG. 18B (the drawings of which alphanumeric includes B) are sectional views cut along A1-A1', A2-A2', ..., and A15-A15' of FIG. 4A, FIG. 5A, ..., and FIG. 18A, respectively. FIG. 4C, FIG. 5C, ..., and FIG. 18C (the drawings of which alphanumeric includes C) are sectional views cut along B1-B1', B2-B2', ..., and B15-B15' of FIG. 4A, FIG. 5A, ..., and FIG. 18A, respectively.

Referring initially to FIGS. 4A to 4C, single-crystal semiconductor layers 51, 33, 52 and 35 are sequentially deposited over a semiconductor substrate 31 by epitaxial growth. The etching rates of materials of the single-crystal semiconductor layers 51 and 52 are larger than those of the semiconductor substrate 31, and the single-crystal semiconductor layers 33 and 35. As the materials of the semiconductor substrate 31 and the single-crystal semiconductor layers 51, 33, 52 and 35, a combination of materials selected from e.g. Si, Ge, SiGe, SiC, SiSn, PbS, GaAs, InP, GaP, GaN and ZnSe can be used. In particular, when the semiconductor substrate 31 is composed of Si, it is preferable that the single-crystal semiconductor layers 51 and 52 are composed of SiGe, and the single-crystal semiconductor layers 33 and 35 are composed of Si. This material combination can ensure a high selection ratio of the single-crystal semiconductor layers 51 and 52 to the single-crystal semiconductor layers 33 and 35, while allowing lattice matching of the single-crystal semiconductor layers 51 and 52 with the single-crystal semiconductor layers 33 and 35. Instead of the single-crystal semiconductor layers 51, 33, 52 and 35, a polycrystalline semiconductor layer, an amorphous semiconductor layer, or a porous semiconductor layer may be used. A combination of these semiconductor layers is also available. Furthermore, instead of the single-crystal semiconductor layers 51 and 52, a metal oxide film, such as a gamma-aluminum oxide film, which allows the formation of the single-crystal semiconductor layers 33 and 35 by epitaxial growth, may be used. Each of the single-crystal semiconductor layers 51, 33, 52, 35 is designed to have a thickness of e.g. about 10-200 nm.

The single-crystal semiconductor layer 35 is thermally oxidized to form a sacrificial oxide film 53 on the top surface thereof Subsequently, an anti-oxidation film 54 is formed over the entire sacrificial oxide film 53 by CVD or another method. As the anti-oxidation film 54, e.g. a silicon nitride film can be used. Alternatively, the anti-oxidation film 54 may be absent.

Referring next to FIGS. 5A to 5C, the anti-oxidation film 54, the sacrificial oxide film 53, and the single-crystal semiconductor layers 35, 52, 33 and 51 are patterned by using photolithography and etching techniques, to thereby form trenches 36 for exposing the semiconductor substrate 31 along a certain direction.

In the case of exposing the semiconductor substrate 31, etching may be stopped at the surface of the semiconductor substrate 31, or alternatively the semiconductor substrate 31 may be over-etched so that a recess is formed in the semiconductor substrate 31. The trenches 36 can be disposed so that the positions thereof correspond with part of element isolation regions in the single-crystal semiconductor layer 33.

In addition, the anti-oxidation film 54, the sacrificial oxide film 53, and the single-crystal semiconductor layers 35 and 52 are patterned by using photolithography and etching techniques, and thus trenches 37 disposed to overlap over the trenches 36 and having a larger width than that of the trenches 36 are formed, to thereby expose the surface of the single-crystal semiconductor layer 33 near the both ends thereof. The trenches 37 can be disposed so that the positions thereof correspond with the element isolation regions in the semiconductor layer 35.

Instead of exposing the surface of the single-crystal semiconductor layer 33, the etching may be stopped at the surface of the single-crystal semiconductor layer 52, or alternatively the single-crystal semiconductor layer 52 may be over-etched so that the etching is stopped at an intermediate position in the single-crystal semiconductor layer 52. By stopping the etching at an intermediate position in the single-crystal semiconductor layer 52, the surface of the single-crystal semiconductor layer 33 in the trench 36 can be prevented from being exposed. Therefore, it becomes possible to reduce the time period during which the single-crystal semiconductor layer 33 in the trench 36 is exposed to an etchant or etching gas at the time of etch-removal of the single-crystal semiconductor layers 51 and 52. Thus, over-etch of the single-crystal semiconductor layer 33 in the trench 36 can be suppressed.

Figure 6A:
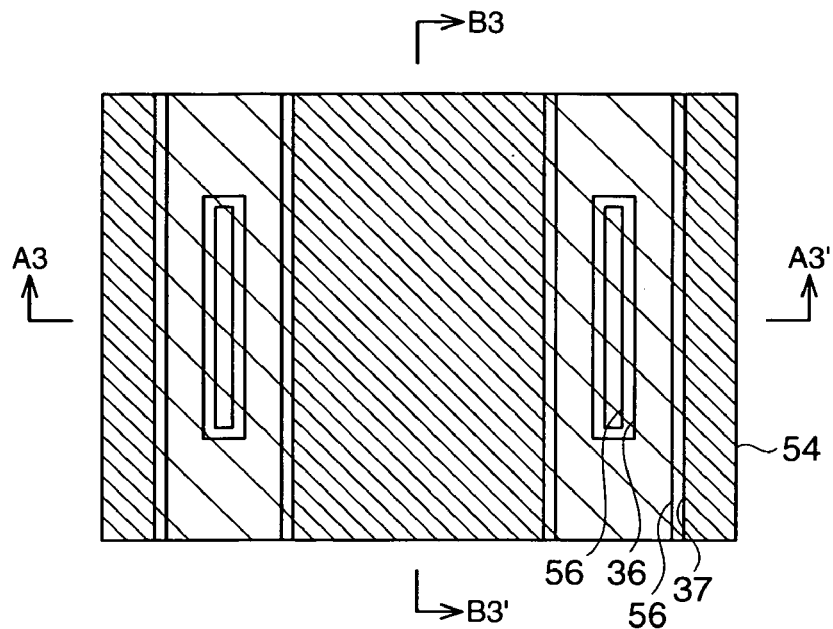
Figure 6B:
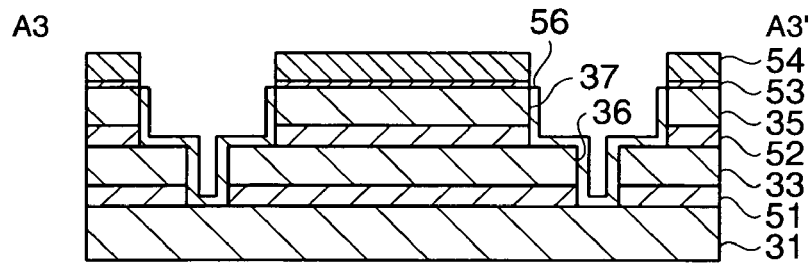
Figure 6C:
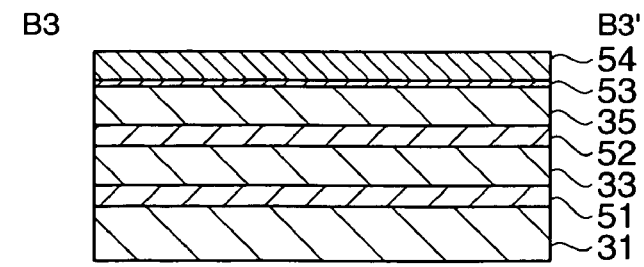

Referring next to FIGS. 6A to 6C, formed in the trenches 36 and 37 are support bodies 56 that are deposited on the sidewalls of the single-crystal semiconductor layers 33, 35, 51 and 52, and support the single-crystal semiconductor layers 33 and 35 over the semiconductor substrate 31. As the material of the support body 56, an insulator such as a silicon oxide film or silicon nitride film can be used.

Alternatively, semiconductor such as poly-silicon or single-crystal silicon may be used as the material of the support body 56. When semiconductor is used as the material of the support bodies 56, selective epitaxial growth of semiconductor can be used for the formation of the support bodies 56. That is, the use of the selective epitaxial growth of semiconductor allows the support bodies 56 to be selectively formed on the sidewalls of the single-crystal semiconductor layers 33, 35, 51 and 52, and the top surface of the semiconductor substrate 31. In particular, when the semiconductor substrate 31 and the single-crystal semiconductor layers 33 and 35 are composed of Si, and the single-crystal semiconductor layers 51 and 52 are composed of SiGe, it is preferable to use Si as the material of the support body 56.

This material combination can ensure a high selection ratio of the single-crystal semiconductor layers 51 and 52 to the support body 56, while allowing lattice matching of the single-crystal semiconductor layers 51 and 52 with the support body 56. In addition, when semiconductor such as Si is used as the material of the support body 56, a three-dimensional structure can be maintained due to the semiconductor even after the single-crystal semiconductor layers 51 and 52 are removed. Thus, chemical resistance and mechanical stress resistance can be enhanced, which achieves a stable element isolation process with good reproducibility.

Figure 7A:
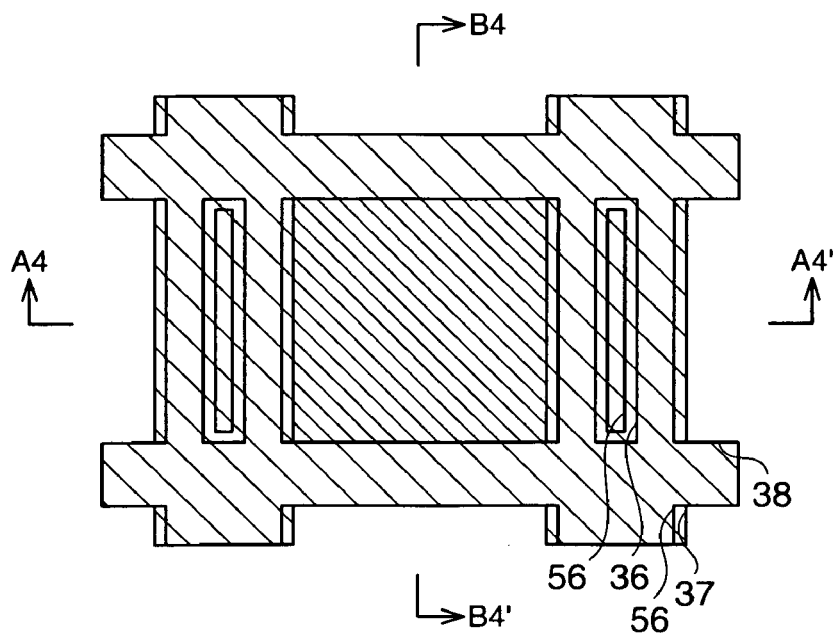
Figure 7B:
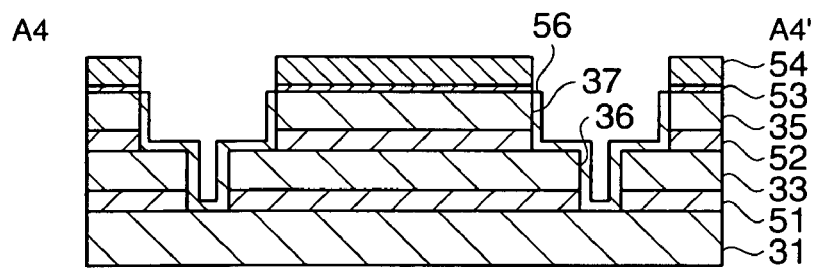
Figure 7C:
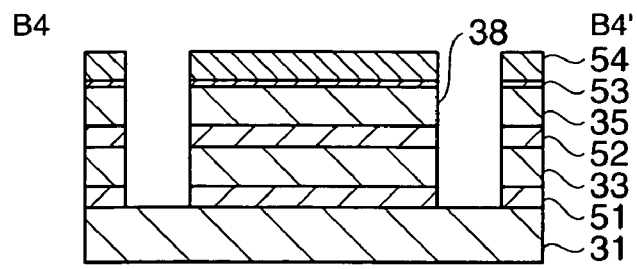

Referring next to FIGS. 7A to 7C, the anti-oxidation film 54, the sacrificial oxide film 53, and the single-crystal semiconductor layers 35, 52, 33 and 51 are patterned by using photolithography and etching techniques, to thereby form trenches 38 for exposing the semiconductor substrate 31 along the direction perpendicular to the direction along which the trenches 36 are formed. In the case of exposing the semiconductor substrate 31, etching may be stopped at the surface of the semiconductor substrate 31, or alternatively the semiconductor substrate 31 may be over-etched so that a recess is formed in the semiconductor substrate 31. The trenches 38 can be disposed so that the positions thereof correspond with the element isolation regions in the single-crystal semiconductor layers 33 and 35.

Figure 8A:
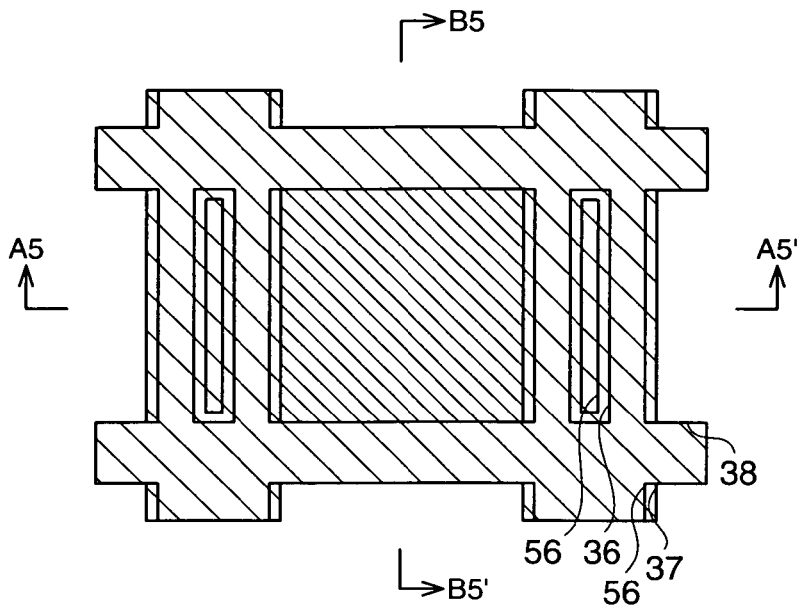
Figure 8B:
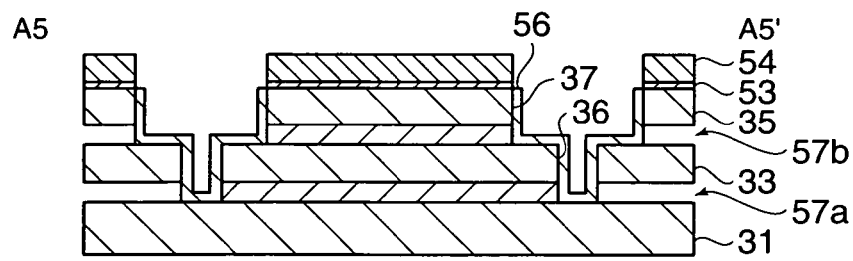
Figure 8C:
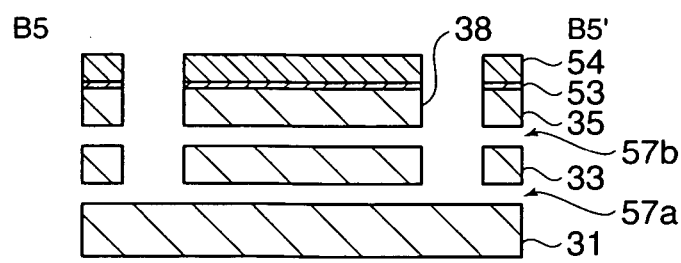

Referring next to FIGS. 8A to 8C, an etching gas or etchant is brought into contact with the single-crystal semiconductor layers 51 and 52 via the trenches 38, to thereby etch-remove the single-crystal semiconductor layers 51 and 52. Thus, a cavity 57a is formed between the semiconductor substrate 31 and the single-crystal semiconductor layer 33, and a cavity 57b is formed between the single-crystal semiconductor layers 33 and 35.

Since the support bodies 56 are provided in the trenches 36 and 37, the single-crystal semiconductor layers 33 and 35 can be supported over the semiconductor substrate 31 even after the single-crystal semiconductor layers 51 and 52 are removed. Furthermore, since the trenches 38 are provided in addition to the trenches 36 and 37, an etching gas or etchant can be brought into contact with the single-crystal semiconductor layers 51 and 52, which are disposed under the single-crystal semiconductor layers 33 and 35, respectively. Thus, insulation among the single-crystal semiconductor layers 33 and 35, and the semiconductor substrate 31 can be ensured without deteriorating the crystalline quality of the single-crystal semiconductor layers 33 and 35.

When the semiconductor substrate 31, the single-crystal semiconductor layers 33 and 35, and the support bodies 56 are composed of Si, and the single-crystal semiconductor layers 51 and 52 are composed of SiGe, it is preferable to use a hydrofluoric nitric acid as an etchant for the single-crystal semiconductor layers 51 and 52. The use of a hydrofluoric nitric acid allows the selection ratio of Si to SiGe to be 1 to about 10-1000, which can remove the single-crystal semiconductor layers 51 and 52 while suppressing over-etch of the semiconductor substrate 31, the single-crystal semiconductor layers 33 and 35, and the support bodies 56. Alternatively, a hydrofluoric nitric acid-peroxide mixture, an ammonia hydrogen-peroxide mixture, a hydrofluoric acetic acid-peroxide mixture or the like may be used as an etchant for the single-crystal semiconductor layers 51 and 52.

Before the single-crystal semiconductor layers 51 and 52 are removed by etching, the single-crystal semiconductor layers 51 and 52 may be turned to porous layers by use of anodization or the like, or alternatively they may be turned to amorphous layers by implementing ion-implantation therefor. Thus, the etching rate of the single-crystal semiconductor layers 51 and 52 can be increased and the etching area thereof can be enlarged.

Figure 9A:
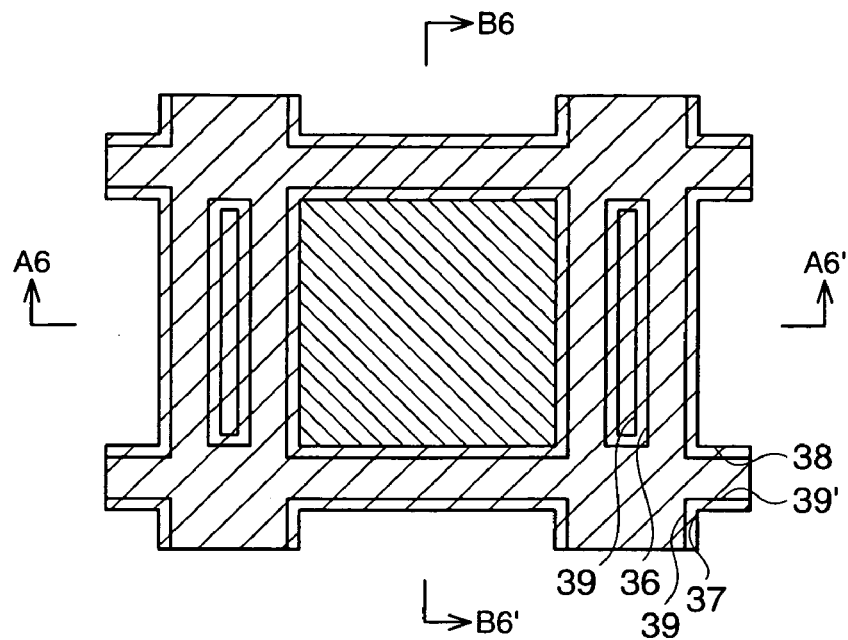
Figure 9B:
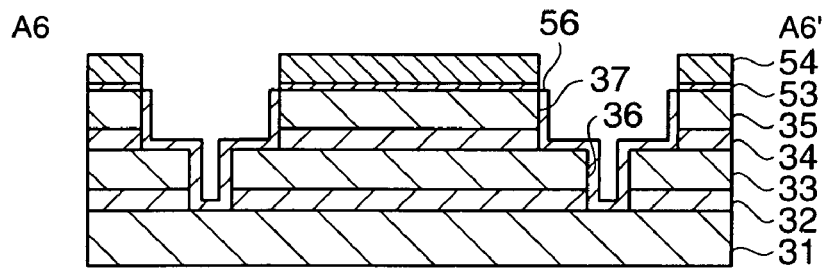
Figure 9C:
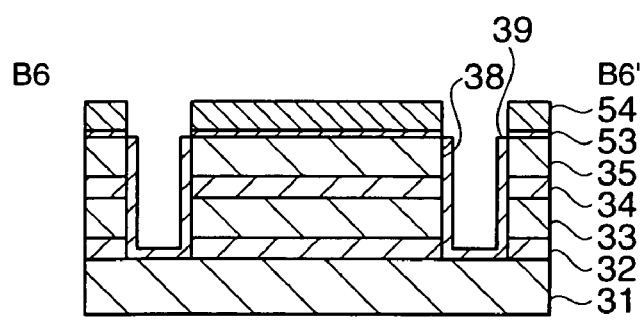

Referring next to FIGS. 9A to 9C, the semiconductor substrate 31 and the single-crystal semiconductor layers 33 and 35 are thermally oxidized. Thus, a buried insulating layer 32 is formed in the cavity 57a between the semiconductor substrate 31 and the single-crystal semiconductor layer 33, and a buried insulating layer 34 is formed in the cavity 57b between the single-crystal semiconductor layers 33 and 35. In the case of forming the buried insulating layers 32 and 34 by thermal oxidization of the semiconductor substrate 31 and the single-crystal semiconductor layers 33 and 35, oxide films 39 are formed on the sidewalls in the trenches 38.

The thicknesses of the single-crystal semiconductor layers 33 and 35 when they are epitaxially grown and the thicknesses of the buried insulating layers 32 and 34 arising from the thermal oxidization of the single-crystal semiconductor layers 33 and 35 allow definition of the thicknesses of the single-crystal semiconductor layers 33 and 35 after element isolation. Thus, the thicknesses of the single-crystal semiconductor layers 33 and 35 can be controlled accurately, and therefore the single-crystal semiconductor layers 33 and 35 having small thicknesses can be formed while allowing suppression of variation in the thicknesses thereof. In addition, since the anti-oxidation film 54 is provided over the single-crystal semiconductor layer 35, the insulating layer 34 can be formed on the backside of the single-crystal semiconductor layer 35 while preventing thermal oxidization of the top surface of the single-crystal semiconductor layer 35.

Furthermore, the trenches 36 and 38 are disposed so that the positions thereof correspond with element isolation regions in the single-crystal semiconductor layer 33, and the trenches 37 and 38 are disposed so that the positions thereof correspond with element isolation regions in the single-crystal semiconductor layer 35. Thus, isolation for the single-crystal semiconductor layers 33 and 35 can be achieved along the lateral and longitudinal directions collectively, and a need is eliminated to provide in the element isolation regions, trenches for removing the single-crystal semiconductor layers 51 and 52. Accordingly, formation of SOI transistors is allowed while suppressing an increase of the number of steps, and an increase of the chip size can be suppressed. Therefore, manufacturing costs of the SOI transistors can be decreased.

After the buried insulating layers 32 and 34 are formed in the cavities 57a and 57b, high-temperature annealing at a temperature above 1000° C. may be implemented. This annealing allows reflow of the buried insulating layers 32 and 34, which can alleviate stress in the buried insulating layers 32 and 34, and can reduce the interface levels of the interfaces between the buried insulating layers 32 and 34, and the single-crystal semiconductor layers 33 and 35. The buried insulating layers 32 and 34 may be formed so that all part of the cavities 57a and 57b are filled, or alternatively may be formed so that part of the cavities 57a and 57b are left as spaces.

As described above, the step in FIG. 9 employs a method in which thermal oxidization of the semiconductor substrate 31 and the single-crystal semiconductor layers 33 and 35 is used to form the buried insulating layers 32 and 34 in the cavities 57a and 57b, which are disposed under the single-crystal semiconductor layers 33 and 35, respectively. Alternatively, insulating films may be deposited in the cavities 57a and 57b by CVD or another method, to fill the cavities 57a and 57b with the insulating layers 32 and 34.

The deposition of insulating films allows the cavities 57a and 57b, which are disposed under the crystalline semiconductor layers 33 and 35, respectively, to be filled with a material other than an oxide film, while preventing the film thickness loss of the single-crystal semiconductor layers 33 and 35. Thus, the buried insulating layers 32 and 34 that are disposed under the crystalline semiconductor layers 33 and 35, respectively, can be formed so as to have large thicknesses, and the dielectric constant thereof can be lowered. Accordingly, the parasitic capacitances on the backside of the crystalline semiconductor layers 33 and 35 can be decreased.

As the material of the buried insulating layers 32 and 34, e.g. a silicon oxide film, a fluorinated silicate glass (FSG) film, or a silicon nitride film may be used. Alternatively, any of the following films may be used as the buried insulating layers 32 and 34: a spin-on-glass (SOG) film, a PSG film, a BPSG film, and an organic low-k film such as a polyarylene ether (PAE) film, a hydrogen silsesquioxane (HSQ) film, a methyl silsesquioxane (MSQ) film, a PCB film, a CF film, an SiOC film, and an SiOF film. More alternatively, a porous film of any of these films may be used.

Figure 10A:
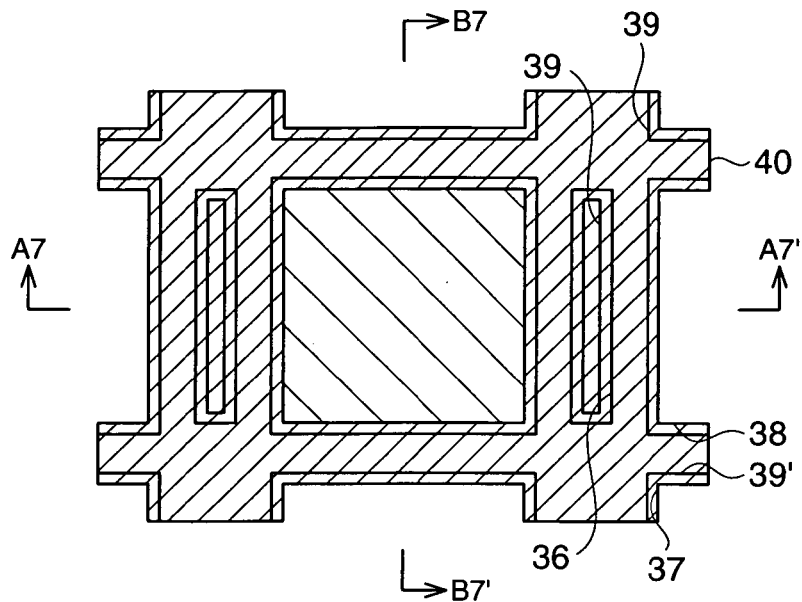
Figure 10B:
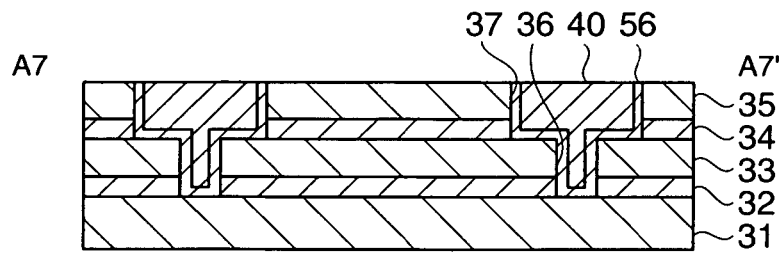
Figure 10C:
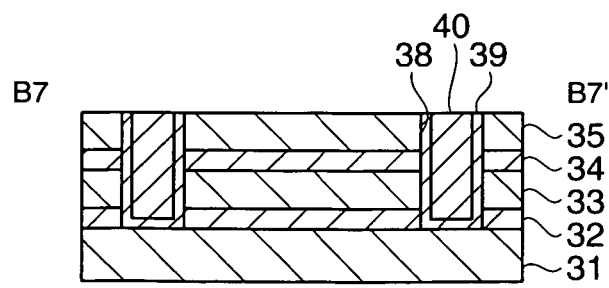

Referring next to FIGS. 10A to 10C, an insulating layer is deposited over the single-crystal semiconductor layer 35 to fill the trenches 36, 37 and 38 by CVD or another method. Subsequently, the insulating layer is planarized by using chemical mechanical polishing (CMP) or another method, to thereby expose the surface of the single-crystal semiconductor layer 35 and form buried insulating layers 40 in the trenches 36 to 38. For the buried insulating layer 40, e.g. $SiO_2$ or $Si_3N_4$ can be used.

Figure 11A:
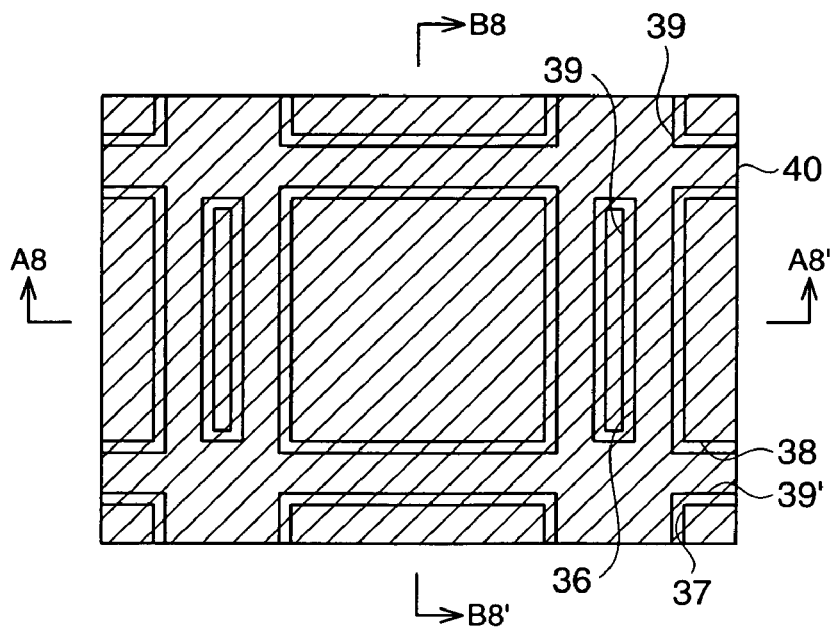
Figure 11B:
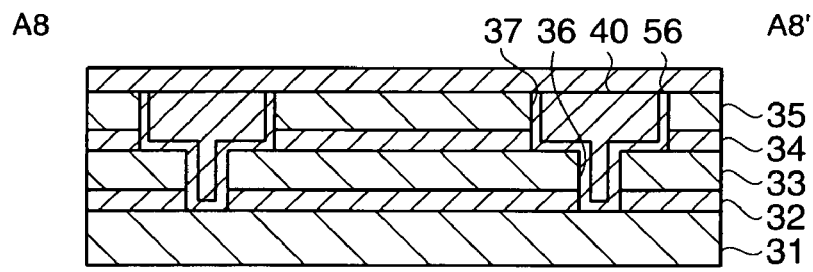
Figure 11C:
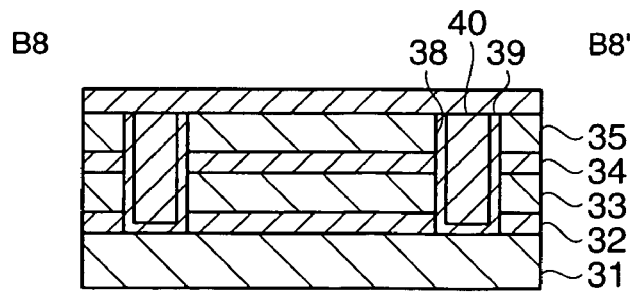

Referring next to FIGS. 11A to 11C, an insulating layer 41 is deposited on the single-crystal semiconductor layer 35 by CVD or another method. For the insulating layer 41, e.g. $SiO_2$ can be used.

Figure 12A:
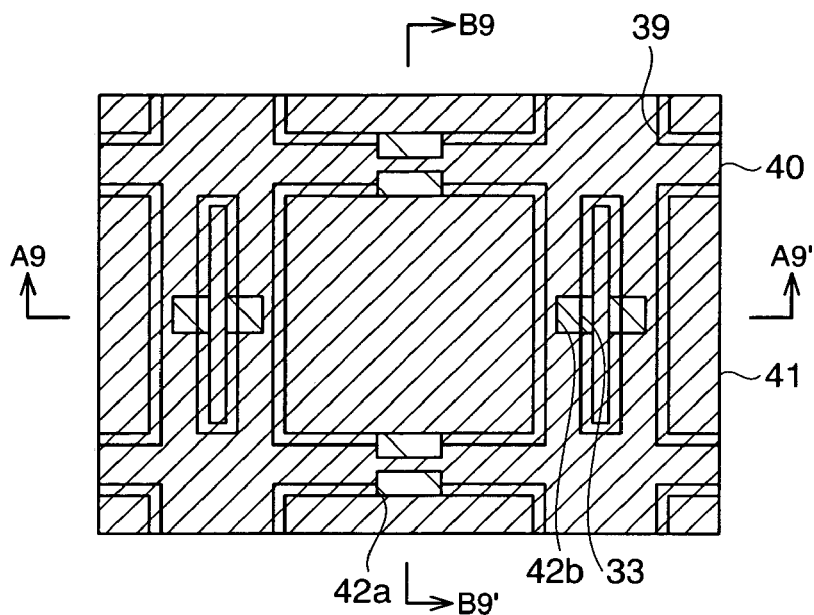
Figure 12B:
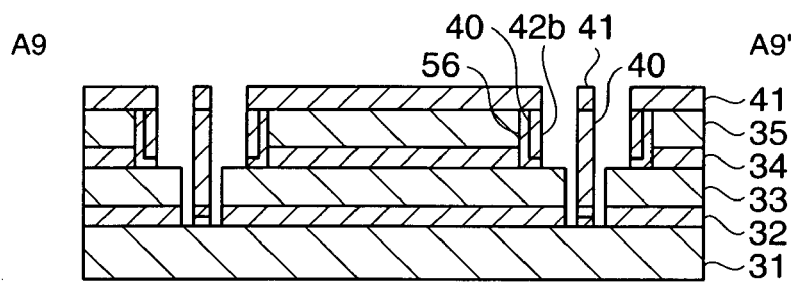
Figure 12C:
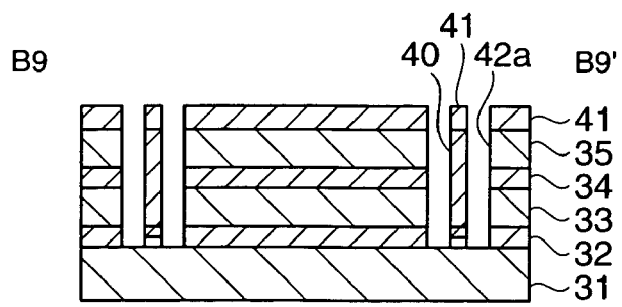

Referring next to FIGS. 12A to 12C, the insulating layer 41, the buried insulating layers 40, the oxide films 39 and the support bodies 56 are patterned by using photolithography and etching techniques, to thereby form openings 42a for exposing the side surfaces of the single-crystal semiconductor layers 33 and 35, and form openings 42b for exposing the top surface of the single-crystal semiconductor layer 33. The openings 42a can be disposed in the element isolation regions in which the trenches 38 are formed. The openings 42b can be disposed in the element isolation regions in which the trenches 36 and 37 are formed.

In the formation of the openings 42a for exposing the side surfaces of the crystalline semiconductor layers 33 and 35, etching may be stopped at the surface of the semiconductor substrate 31, or alternatively the semiconductor substrate 31 may be over-etched so that a recess is formed in the semiconductor substrate 31. Note that the semiconductor substrate 31 does not necessarily need to be exposed due to the formation of the openings 42a for exposing the side surfaces of the crystalline semiconductor layers 33 and 35. Etching may be stopped at the surface of the insulating layer 32, or alternatively the insulating layer 32 may be over-etched so that a recess is formed in the insulating layer 32.

When the openings 42b for exposing the top surface of the single-crystal semiconductor layer 33 are formed, the openings 42b can be disposed on ends of the single-crystal semiconductor layer 33. Thus, electrical contact to the single-crystal semiconductor layer 33 can be ensured at the ends of the single-crystal semiconductor layer 33. Therefore, the area, on the chip face, of contact regions of the single-crystal semiconductor layer 33 can be reduced, which can decrease the chip size.

Since the width of the trenches 37 is set larger than that of the trenches 36, the surface of the single-crystal semiconductor layer 33 near the both ends thereof can be exposed through the single-crystal semiconductor layer 35, which is the upper layer. Thus, contact to the single-crystal semiconductor layer 33, which is the lower layer, can be ensured while preventing the manufacturing process from being complicated.

Figure 13A:
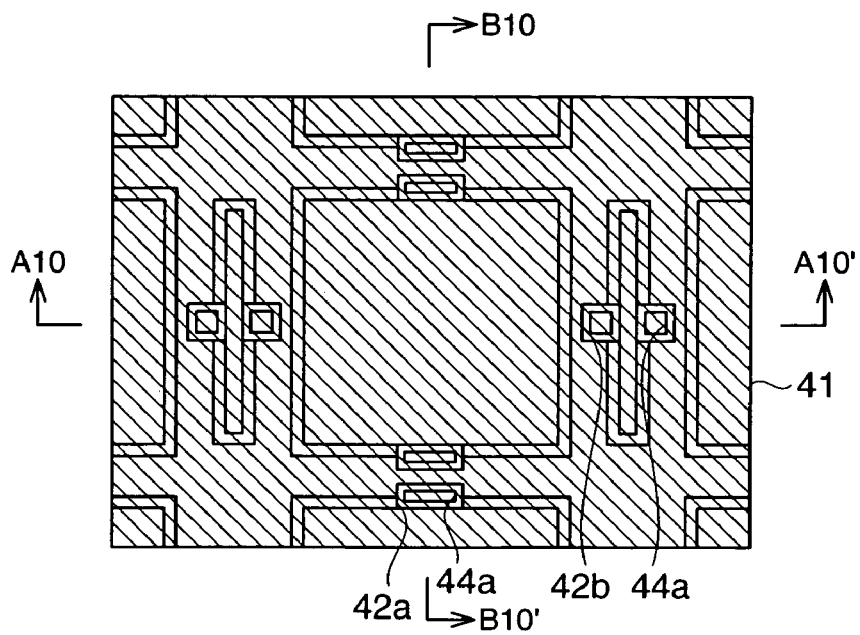
Figure 13B:
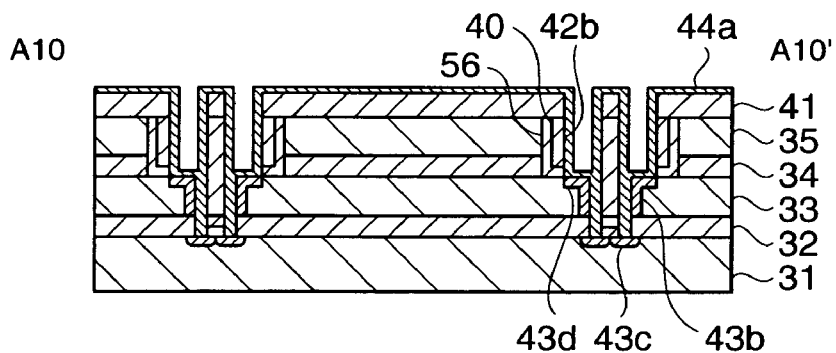
Figure 13C:
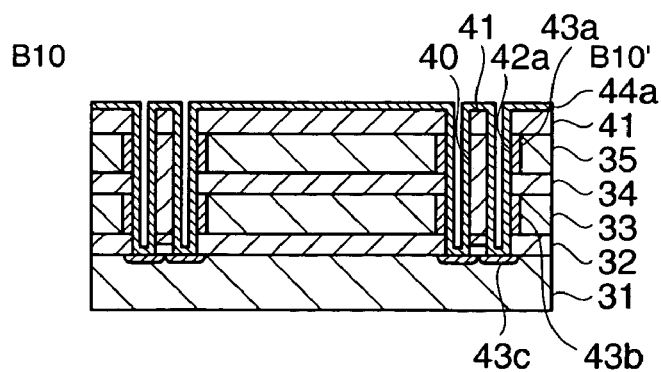

Referring next to FIGS. 13A to 13C, the semiconductor substrate 31 and the single-crystal semiconductor layers 33 and 35 are thermally oxidized. Thus, gate insulating films 43a and 43b are formed on the sidewalls of the single-crystal semiconductor layers 35 and 33, respectively, and gate insulating films 43c are formed on the top surface of the semiconductor substrate 31 in the openings 42a and 42b. When the semiconductor substrate 31 and the single-crystal semiconductor layers 33 and 35 are thermally oxidized, gate insulating films 43d are formed on the top surface of the single-crystal semiconductor layer 33 in the openings 42b.

Subsequently, by CVD or another method, a conductive film 44a is deposited over the entire insulating layer 41 so as to cover the gate insulating films 43a to 43d in the openings 42a and 42b. As the material of the conductive film 44a, polycrystalline silicon or a metal film such as a W or TiN film may be used. Before the gate insulating films 43a and 43b are formed on the sidewalls of the single-crystal semiconductor layers 35 and 33, respectively, a sacrificial oxide film may be formed on the sidewalls of the single-crystal semiconductor layers 35 and 33 by thermal oxidation, so that the gate insulating films 43a and 43b are formed after the sacrificial oxide film is removed.

Figure 14A:
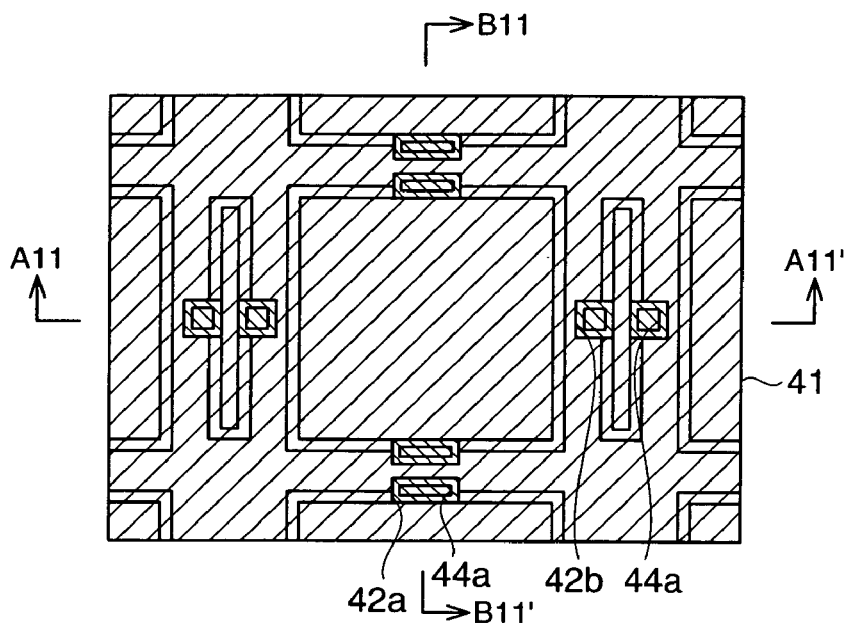
Figure 14B:
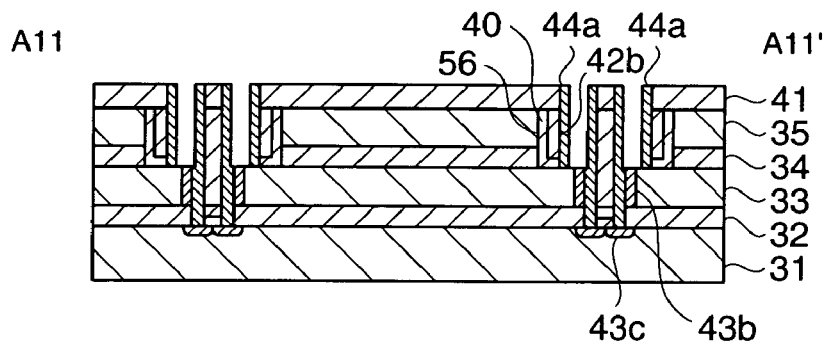
Figure 14C:
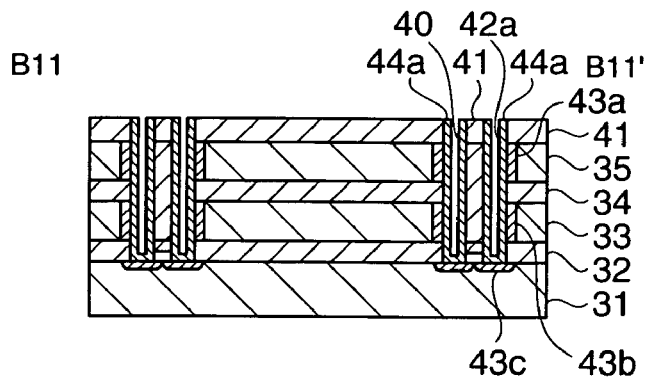

Referring next to FIGS. 14A to 14C, the conductive film 44a is selectively etched back by using photolithography and anisotropic etching techniques, to thereby remove the conductive film 44a on the gate insulating films 43d in the openings 42b. Subsequently, the gate insulating films 43d in the openings 42b are etched by using photolithography and anisotropic etching techniques, to thereby remove the gate insulating films 43d in the openings 42b. Thus, the surface of the single-crystal semiconductor layer 33 near the both ends thereof is exposed.

Figure 15A:
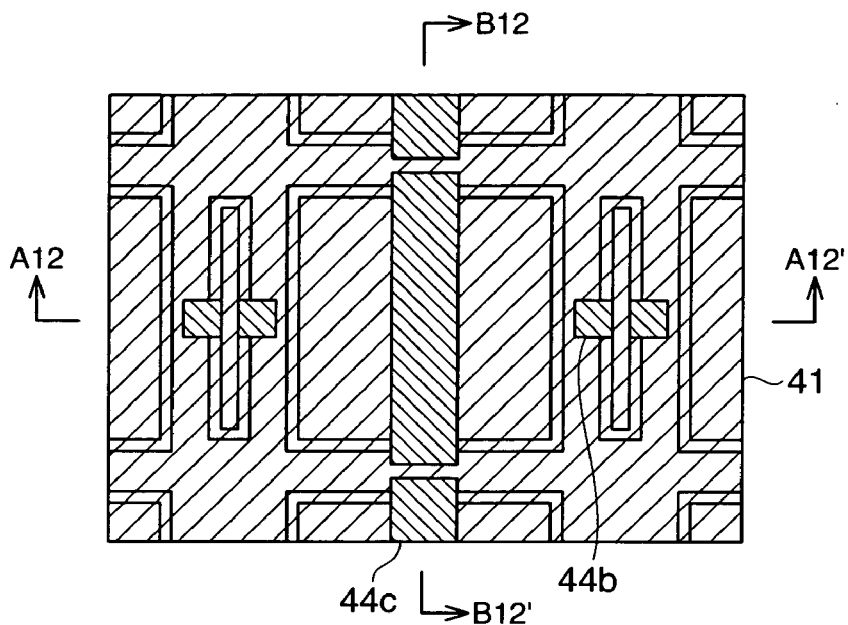
Figure 15B:
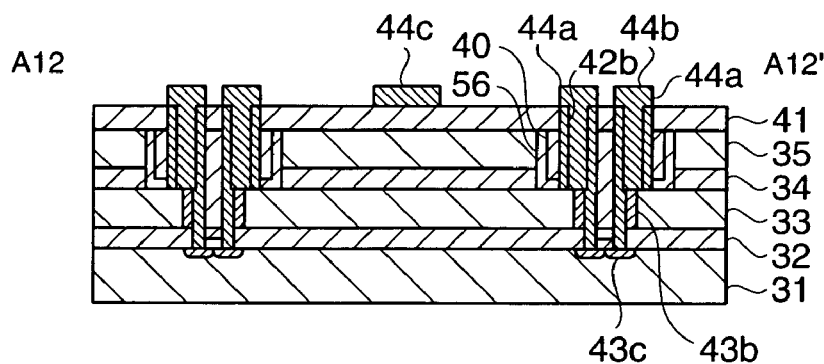
Figure 15C:
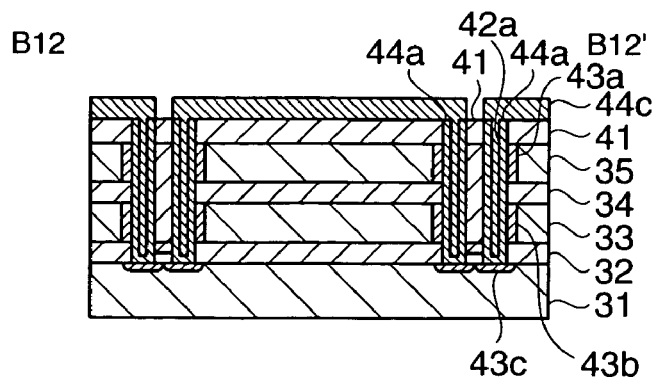

Referring next to FIGS. 15A to 15C, a conductive layer is deposited over the insulating layer 41 to fill the openings 44a and 42b by CVD or another method. The conductive layer is then patterned by using photolithography and etching techniques. This patterning forms a gate electrode 44c that is deposited across over the top surface of the semiconductor layer 35 and is provided also in the openings 42a. The patterning also forms in the openings 42b, contact layers 44b for ensuring electrical contact to the single-crystal semiconductor layer 33.

The provision of the gate electrode 44c in the openings 44a allows the gate electrode 44c to be deposited upright over the semiconductor substrate 31, and allows sharing of the gate electrode 44c by field effect transistors that are formed in the single-crystal semiconductor layers 33 and 35, respectively. Therefore, the occupation area of the gate electrode 44c in the chip face can be reduced, and the interconnect length of the gate electrode 44c can be decreased. Thus, high-density integration of field effect transistors can be achieved while suppressing propagation delay, and the chip size can be decreased. Accordingly, speed-up, miniaturization, and cost reduction of field effect transistors can be achieved.

In addition, since the gate electrode 44c and the contact layers 44b are formed in the same step, three-dimensional integration of field effect transistors can be achieved while allowing simplification of the manufacturing process. As the materials of the conductive layers 44b and the gate electrode 44c, polycrystalline silicon or a metal film such as a W or TiN film may be used.

Figure 16A:
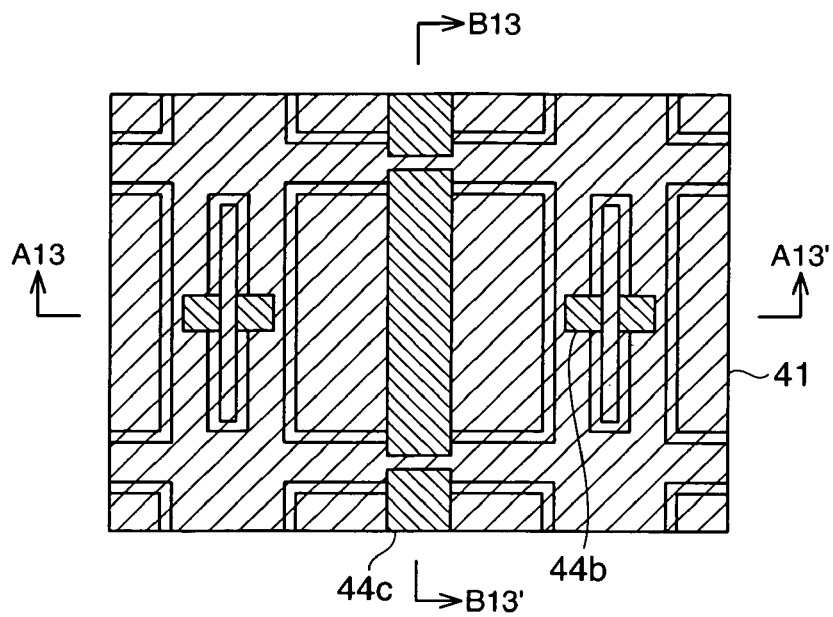
Figure 16B:
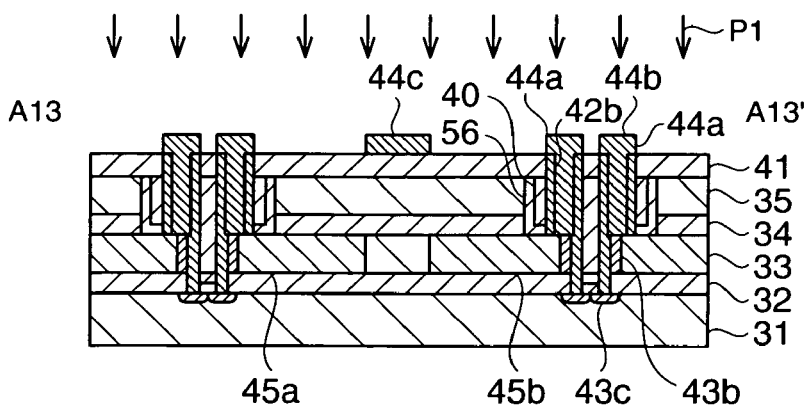
Figure 16C:
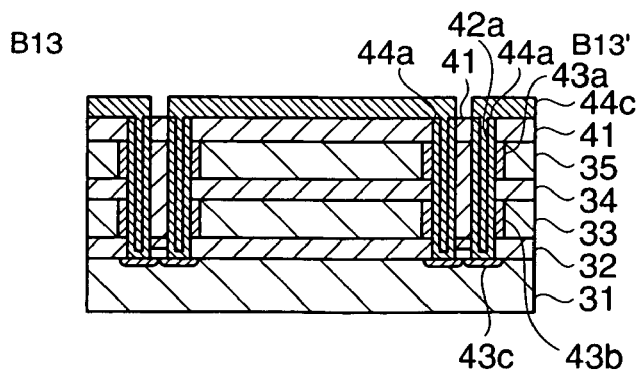

Referring next to FIGS. 16A to 16C, impurity ion-implantation P1 is selectively carried out through the top surface of the single-crystal semiconductor layer 35. Thus, source and drain layers 45a and 45b that are disposed on the respective sides of the gate electrode 44c are formed in the single-crystal semiconductor layer 33. In the formation of the source and drain layers 45a and 45b in the single-crystal semiconductor layer 33, the energy of the ion-implantation P1 can be selected so that the impurity range correspond to the depth of the single-crystal semiconductor layer 33.

Since the gate electrode 44c is disposed across over the top surface of the single-crystal semiconductor layer 35, which is the uppermost semiconductor layer, the ion-implantation through the top surface of the single-crystal semiconductor layer 35 allows the source and drain layers 45a and 45b to be formed in the single-crystal semiconductor layer 33 with use of the gate electrode 44c as a mask. Thus, the source and drain layers 45a and 45b can be formed in a self-aligned manner with respect to the gate electrode 44c disposed on the sidewalls of the single-crystal semiconductor layer 33.

Figure 17A:
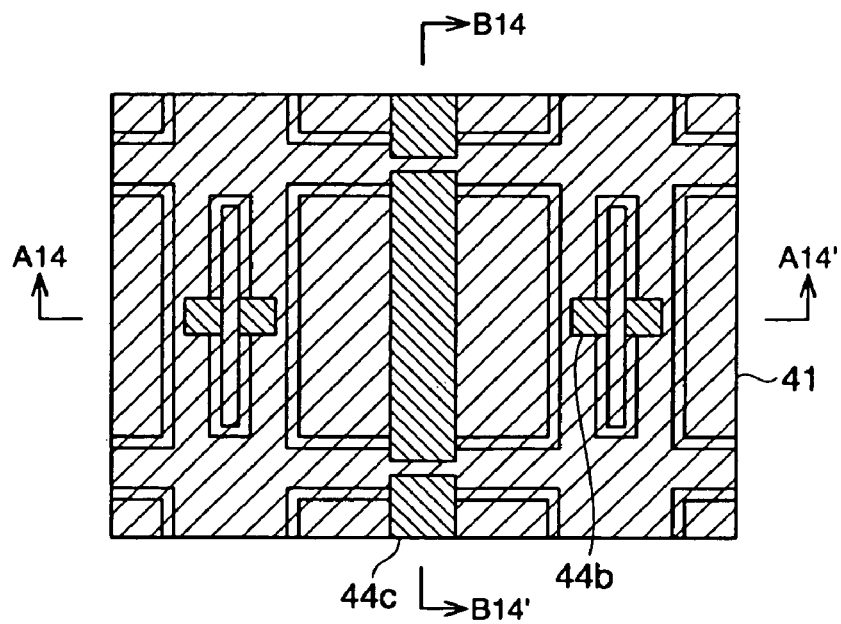
Figure 17B:
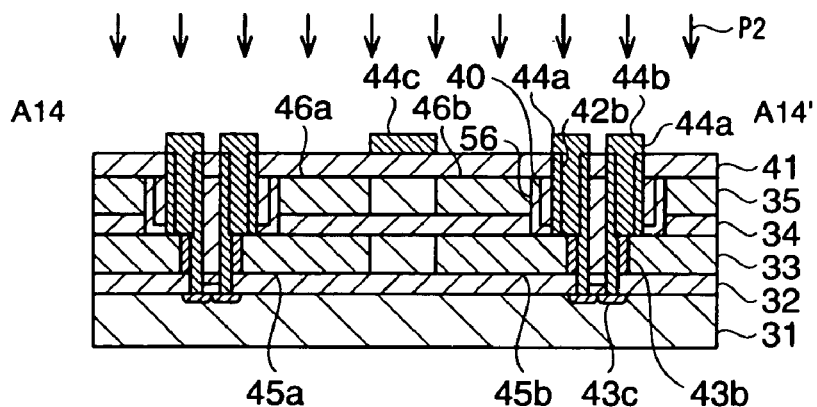
Figure 17C:
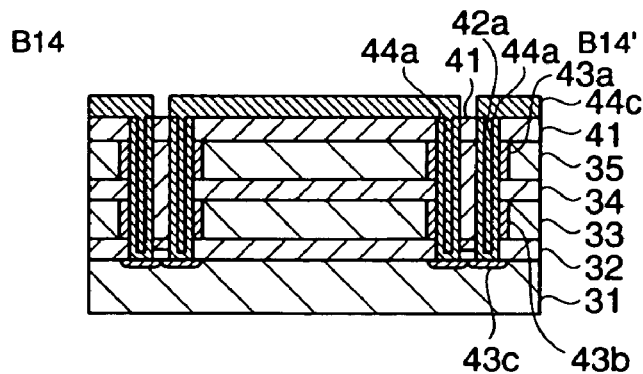

Referring next to FIGS. 17A to 17C, impurity ion-implantation P2 is selectively carried out through the top surface of the single-crystal semiconductor layer 35. Thus, source and drain layers 46a and 46b that are disposed on the respective sides of the gate electrode 44c are formed in the single-crystal semiconductor layer 35. In the formation of the source and drain layers 46a and 46b in the single-crystal semiconductor layer 35, the energy of the ion-implantation P2 can be selected so that the impurity range correspond to the depth of the single-crystal semiconductor layer 35.

Since the gate electrode 44c is disposed across over the top surface of the single-crystal semiconductor layer 35, which is the uppermost semiconductor layer, the ion-implantation through the top surface of the single-crystal semiconductor layer 35 allows the source and drain layers 46a and 46b to be formed in the single-crystal semiconductor layer 35 with use of the gate electrode 44c as a mask. Thus, the source and drain layers 46a and 46b can be formed in a self-aligned manner with respect to the gate electrode 44c disposed on the sidewalls of the single-crystal semiconductor layer 35.

Moreover, since the gate electrode 44c is provided on the sidewalls on the both sides of the single-crystal semiconductor layers 33 and 35, channel regions can be formed on the sidewalls on the both sides of the single-crystal semiconductor layers 33 and 35. Thus, the drive capability of field effect transistors can be increased while preventing the manufacturing process from being complicated, and an increase of the chip size can be suppressed. Accordingly, speed-up, miniaturization and cost reduction of the field effect transistors can be achieved.

The conductivity type of the source and drain layers 45a and 45b may be different from that of the source and drain layers 46a and 46b. When the different conductivity types are thus employed, P-channel field effect transistors and N-channel field effect transistors can be deposited on top of each other over the same substrate. Thus, CMOS inverters, NAND circuits, NOR circuits or the like can be constructed while allowing three-dimensional deposition of field effect transistors. Accordingly, a flip-flop, an SRAM or the like hybridized with a memory or logic can be constructed while suppressing an increase of the chip size.

In the formation of the source and drain layers 45a and 45b in the single-crystal semiconductor layer 33 by the ion-implantation P1, it is preferable to ion-implant boron into the single-crystal semiconductor layer 33 to thereby form a P-type impurity diffusion layer in the single-crystal semiconductor layer 33. In contrast, in the formation of the source and drain layers 46a and 46b in the single-crystal semiconductor layer 35 by the ion-implantation P2, it is preferable to ion-implant phosphorous or arsenic into the single-crystal semiconductor layer 35 to thereby form an N-type impurity diffusion layer in the single-crystal semiconductor layer 35.

According to such a combination of impurities, an impurity having a small mass number can be implanted into the single-crystal semiconductor layer 33, which is the lower layer, and an impurity having a large mass number can be implanted into the single-crystal semiconductor layer 35, which is the upper layer. Therefore, although an impurity is implanted into the lower single-crystal semiconductor layer 33 through the upper single-crystal semiconductor layer 35, damage to the upper single-crystal semiconductor layer 35 can be suppressed.

The implantation of boron into the single-crystal semiconductor layer 33 by the ion-implantation P1 can form, in the single-crystal semiconductor layer 33, the $V_{DD}$ interconnect for providing the $V_{DD}$ potential, and the source and drain layers 45a and 45b of the P-ch FETs T1 and T3 of FIG. 2. In addition, the implantation of phosphorous or arsenic into the single-crystal semiconductor layer 33 by the ion-implantation P1 can form, in the single-crystal semiconductor layer 33, the source and drain layers 45a and 45b of the transfer gate T5 of FIG. 2. In addition, the implantation of phosphorous or arsenic into the single-crystal semiconductor layer 35 by the ion-implantation P2 can form, in the single-crystal semiconductor layer 35, the $V_{SS}$ interconnect for providing the $V_{SS}$ potential, and the source and drain layers 46a and 46b of the transfer gate T6 and the N-ch FETs T2 and T4 of FIG. 2.

Thus, a flip-flop can be formed of the CMOS inverters IV1 and IV2 in FIG. 2, and the P-ch FETs T1 and T3 and the N-ch FETs T2 and T4, which construct the flip-flop, can be stacked. In addition, the transfer gates T5 and T6 can be formed in the single-crystal semiconductor layers 33 and 35, respectively, in which the flip-flop is formed. Therefore, an SRAM can be achieved without horizontally arranging six transistors included in each cell of the SRAM on the same two-dimensional plane. Accordingly, high-speed operation of the SRAM is allowed while reducing power consumption thereof, and high-density integration of the SRAM can be achieved.

Figure 18B:
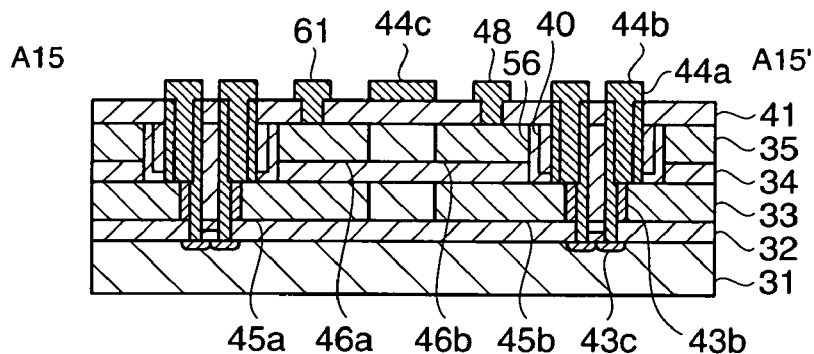
Figure 18C:
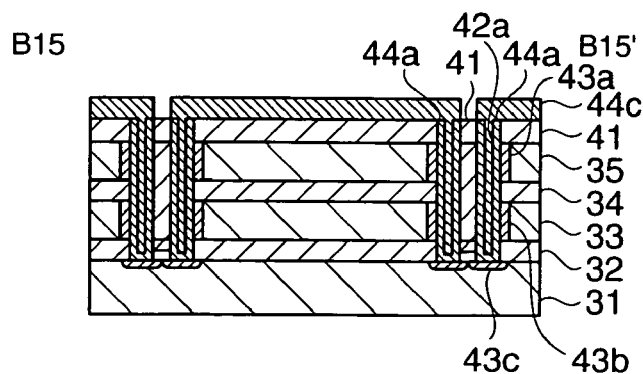

Referring next to FIGS. 18A to 18C, the insulating layer 41 is patterned by using photolithography and etching techniques, to thereby form openings 61 for exposing the surfaces of the source and drain layers 46a and 46b. A conducive layer is then deposited by CVD or another method over the insulating layer 41 so as to fill the openings 61. Subsequently, the conductive layer is patterned by using photolithography and etching techniques, to thereby form on the insulating layer 41, contact layers 48 for ensuring electrical contact to the source and drain layers 46a and 46b.

The above-described embodiment employs a method in which the buried insulating layer 40 is provided in the trenches 36 to 38 collectively after the formation of the buried insulating layers 32 and 34. Alternatively, an insulator may be buried in the trenches 36 and 37 in which the support bodies 56 are formed before the trenches 38 are formed. Such a method can reinforce the support bodies 56 by the insulator. Thus, even when the widths of the trenches 36 and 37 are small, the single-crystal semiconductor layers 33 and 35 can be stably supported over the semiconductor substrate 31.

Furthermore, the above-described embodiment employs a multi-layered structure of two semiconductor layers: the single-crystal semiconductor layers 33 and 35. Alternatively, three or more single-crystal semiconductor layers may be deposited with the intermediary of insulating films there among. Moreover, the above-described embodiment employs a method in which the anti-oxidation film 54 is formed over the single-crystal semiconductor layer 35 in order to prevent thermal oxidation of surface of the single-crystal semiconductor layer 35 at the time of the formation of the insulating layers 32 and 34. Alternatively, the insulating layers 32 and 34 may be formed without forming the anti-oxidation film 54 over the single-crystal semiconductor layer 35.

In addition, the above-described embodiment employs a method in which the gate electrode 44c and the contact layers 44b are formed collectively. However, the gate electrode 44c and the contact layers 44b do not necessarily need to be formed collectively. For example, the contact layers 44b and 48 may be formed after the source and drain layers 45a, 45b, 46a and 46b are formed with use of the gate electrode 44c that has been formed.

Furthermore, the above-described embodiment employs a method in which the gate electrode 44c is used as a mask for forming the source and drain layers 45a, 45b, 46a and 46b. Alternatively, a resist pattern for forming the gate electrode 44c may be used as an ion-implantation mask when the source and drain layers 45a, 45b, 46a and 46b are formed.

In addition, when the source and drain layers 45a, 45b, 46a and 46b are formed in a self-aligned manner with respect to the gate electrode 44c, the following method may be employed. Specifically, before the gate electrode 44c is formed, formed in the insulating layer 41 are openings for exposing parts to serve as a channel region in the top surface of the single-crystal semiconductor layer 35 and the side surfaces of the single-crystal semiconductor layers 33 and 35. Subsequently, ion-implantation is carried out by using as a mask the insulating layer 41 in which the openings for exposing the parts to serve as a channel region are formed, and thus the source and drain layers 45a, 45b, 46a and 46b are formed. Subsequently to the formation of the source and drain layers 45a, 45b, 46a and 46b, the gate electrode 44c is buried in the openings formed in the insulating layer 41. Thus, the source and drain layers 45a, 45b, 46a and 46b can be formed in a self-aligned manner with respect to the gate electrodes 44c.

The entire disclosure of Japanese Patent Application Nos: 2005-064996, filed Mar. 9, 2005, and 2006-040478, filed Feb. 17, 2006 are expressly incorporated by reference herein.

What is claimed is:

1. A method of manufacturing a semiconductor device, comprising:

forming on a semiconductor substrate, a plurality of multi-layered structures each including a first semiconductor layer and a second semiconductor layer that is deposited over the first semiconductor layer and has an etching rate smaller than the etching rate of the first semiconductor layer;

forming a first trench through the first semiconductor layer and the second semiconductor layer, the first trench exposing the semiconductor substrate;

forming a support body on sidewalls of the first semiconductor layer and the second semiconductor layer in the first trench, the support body supporting the second semiconductor layer over the semiconductor substrate;

forming a second trench that exposes through the second semiconductor layer, at least part of the first semiconductor layer of which sidewall has the support body thereon;

etching the first semiconductor layer via the second trench selectively, to form under the second semiconductor layer, a cavity resulting from removal of the first semiconductor layer;

forming a buried insulating layer that is buried in the cavity;

exposing a side surface of the deposited second semiconductor layer through the insulating layer;

forming a gate insulating film on the exposed side surface of the second semiconductor layer;

forming a gate electrode over the side surface of the second semiconductor layer with intermediary of the gate insulating film therebetween;

implementing first ion-implantation through the top surface of the second semiconductor layer, to form in the second semiconductor layer at a lower layer level, first source and drain layers on respective sides of the gate electrode; and implementing second ion-implantation through the top surface of the second semiconductor layer, to form in the second semiconductor layer at an upper layer level, second source and drain layers on respective sides of the gate electrode.

2. The method of manufacturing a semiconductor device according to claim 1, wherein:

the first ion-implantation implants boron in the second semiconductor layer at the lower layer level, to form in the second semiconductor layer at the lower layer level, an interconnect for providing a first potential, and source and drain layers of a P-channel field effect transistor that forms a flip-flop circuit; and the second ion-implantation implants phosphorous or arsenic in the second semiconductor layer at the upper layer level, to form in the second semiconductor layer at the upper layer level, an interconnect for providing a second potential, and source and drain layers of an N-channel field effect transistor that forms the flip-flop circuit.

3. The method of manufacturing a semiconductor device according to claim 1, wherein:

the first ion-implantation implants boron in the second semiconductor layer at the lower layer level, to form in the second semiconductor layer at the lower layer level, an interconnect for providing a first potential, and source and drain layers of P-channel field effect transistors that form a flip-flop circuit;

the second ion-implantation implants phosphorous or arsenic in the second semiconductor layer at the upper layer level, to form in the second semiconductor layer at the upper layer level, an interconnect for providing a second potential, and source and drain layers of N-channel field effect transistors that form the flip-flop circuit and a first transfer gate; and a third ion-implantation implants phosphorous or arsenic in the second semiconductor layer at the lower layer level, to form in the second semiconductor layer at the lower layer level, an interconnect for providing source and drain layers of N-channel field effect transistors that form a second transfer gate.

* * * * *